(12) United States Patent
Keeth et al.

(10) Patent No.: US 6,807,114 B2
(45) Date of Patent: Oct. 19, 2004

(54) METHOD AND SYSTEM FOR SELECTING REDUNDANT ROWS AND COLUMNS OF MEMORY CELLS

(75) Inventors: Brent Keeth, Boise, ID (US); Troy A. Manning, Meridian, ID (US); Chris G. Martin, Boise, ID (US); Ebrahim H. Hargan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 29 days.

(21) Appl. No.: 10/347,041

(22) Filed: Jan. 17, 2003

(65) Prior Publication Data

US 2004/0141384 A1 Jul. 22, 2004

(51) Int. Cl.[7] .................................................. G11C 7/00
(52) U.S. Cl. ................................ 365/200; 365/189.05
(58) Field of Search ........................... 365/200, 189.05, 365/225.7, 230.06

(56) References Cited

U.S. PATENT DOCUMENTS

| 5,495,447 A | 2/1996 | Butler et al. ................ 365/200 |
| 5,577,050 A | * 11/1996 | Bair et al. ................... 714/710 |
| 5,845,315 A | 12/1998 | Cutter ......................... 711/104 |
| 5,848,009 A | 12/1998 | Lee et al. .................... 365/200 |
| 5,953,269 A | 9/1999 | Manning ..................... 365/200 |
| 5,959,903 A | * 9/1999 | Chen et al. .................. 365/200 |
| 6,055,204 A | 4/2000 | Bosshart ................. 365/230.06 |
| 6,097,644 A | 8/2000 | Shirley ........................ 365/200 |
| 6,108,251 A | 8/2000 | Manning ..................... 365/200 |
| 6,172,916 B1 | 1/2001 | Ooishi .................... 365/189.02 |
| 6,181,614 B1 | 1/2001 | Aipperspach et al. ....... 365/200 |
| 6,195,762 B1 | 2/2001 | Shore ............................. 714/8 |
| 6,199,177 B1 | 3/2001 | Blodgett ........................ 714/7 |
| 6,205,063 B1 | 3/2001 | Aipperspach et al. ....... 365/200 |
| 6,223,248 B1 | 4/2001 | Bosshart ..................... 711/105 |

(List continued on next page.)

Primary Examiner—Vu A. Le
(74) Attorney, Agent, or Firm—Dorsey & Whitney LLP

(57) ABSTRACT

A system and method for selecting redundant rows and columns of memory devices includes a column select steering circuit to couple column select signals from a column address decoder to an array of memory cells. The system and method also includes a fuse banks for programming respective addresses of up to two defective columns that are to be repaired. The programmed addresses are applied to a defective column decoder that determines which column select signal(s) should be shifted downwardly and which column select signal(s) should be shifted upwardly. The column select steering circuit responds to signals from the defective column decoder to shift the column select signals downwardly or upwardly. The column select signal for the lowest column is shifted downwardly to a redundant column, and the column select signal for the highest column is shifted upwardly to a redundant column.

75 Claims, 13 Drawing Sheets

U.S. PATENT DOCUMENTS

| | | | |
|---|---|---|---|
| 6,243,320 B1 | 6/2001 | Hamamoto et al. | 365/230.08 |
| 6,272,056 B1 | 8/2001 | Ooishi | 365/200 |
| 6,307,795 B1 | 10/2001 | Blodgett | 365/200 |
| 6,310,804 B1 | 10/2001 | Waller et al. | 365/200 |
| 6,314,030 B1 | 11/2001 | Keeth | 365/200 |
| 6,320,804 B2 | 11/2001 | Dähn | 365/201 |
| 6,331,956 B1 | 12/2001 | Ooishi et al. | 365/200 |
| 6,333,892 B2 | 12/2001 | Hamamoto et al. | 365/230.08 |
| 6,366,508 B1 * | 4/2002 | Agrawal et al. | 365/200 |
| 6,366,509 B2 | 4/2002 | Shirley | 365/200 |
| 6,381,174 B1 | 4/2002 | Roohparvar et al. | 365/185.09 |
| 6,385,100 B2 | 5/2002 | Noda et al. | 365/189.12 |
| 6,393,504 B1 | 5/2002 | Leung et al. | 710/104 |
| 6,438,064 B2 | 8/2002 | Ooishi | 365/230.03 |
| 6,442,084 B2 | 8/2002 | Keeth | 365/200 |
| 6,459,630 B2 | 10/2002 | Nakayama et al. | 365/200 |
| 6,477,662 B1 | 11/2002 | Beffa et al. | 714/7 |
| 6,507,524 B1 | 1/2003 | Agrawal et al. | 365/200 |
| 6,519,192 B2 | 2/2003 | Ooishi | 365/200 |
| 6,521,958 B1 | 2/2003 | Forbes et al. | 257/391 |
| 6,531,339 B2 | 3/2003 | King et al. | 438/110 |
| 6,535,436 B2 | 3/2003 | Brady | 365/200 |
| 6,538,938 B2 | 3/2003 | Fister | 365/201 |
| 6,552,937 B2 | 4/2003 | Ladner et al. | 365/200 |
| 6,567,323 B2 | 5/2003 | Pitts et al. | 365/200 |
| 6,587,386 B2 | 7/2003 | Blodgett | 365/200 |
| 6,621,751 B1 | 9/2003 | Abedifard et al. | 365/200 |
| 6,668,345 B1 | 12/2003 | Ooishi et al. | 714/710 |
| 6,671,834 B1 | 12/2003 | Zhu et al. | 714/711 |
| 6,700,821 B2 | 3/2004 | Forbes et al. | 365/189.01 |
| 6,711,056 B2 | 3/2004 | Abedifard et al. | 365/185.09 |
| 6,724,670 B2 | 4/2004 | Jones et al. | 365/200 |
| 6,725,403 B1 | 4/2004 | Schmoelz | 714/723 |

* cited by examiner

METHOD AND SYSTEM FOR SELECTING REDUNDANT ROWS AND COLUMNS OF MEMORY CELLS

TECHNICAL FIELD

This invention relates to memory devices, and more particularly, to a method and system for activating redundant rows and columns of memory cells when a row or column of memory cells corresponding to a row or column address is defective.

BACKGROUND OF THE INVENTION

Integrated circuits using large-scale integration techniques are presently manufactured with a high degree of reliability. However, such integrated circuits contain a very large number of components so that, even with highly reliable manufacturing techniques, there is a significant probability of one or more components being defective. For example, presently manufactured dynamic random access memory ("DRAM") devices can contain a billion components. Even though the defect rate may be less than one defect/million components, a fairly high percentage of such memory devices contain memory cells that are defective and therefore cannot be used.

The manufacturing yield of memory devices would be considerably lower, and their cost considerably higher, if it was necessary to scrap all memory devices containing one or more defects. To avoid the need to scrap memory devices in such cases, internal repair capabilities have been developed that allow defective circuit elements to be replaced by redundant circuit elements. For example, if one or more memory cells in a row of memory cells are defective, a redundant row of memory cells may be substituted for each defective row. Similarly, if one or more memory cells in a column of memory cells are defective, a redundant column of memory cells may be substituted for each defective column. This "repair" of memory devices is normally performed during post-manufacturing testing before the memory device has been packaged. The repair is typically carried out by programming banks of fuses or anti-fuses with a row or column address corresponding to a defective row of memory cells or column of memory cells, respectively.

After a memory device has been repaired as described above, the redundant rows or columns are substituted for the defective rows or columns during use as the defective row or column is addressed. Generally, each row address is compared to a bank of fuses or anti-fuses identifying defective rows, and each column address is compared to a bank of fuses or anti-fuses identifying defective columns. In the event of a match, either of two techniques is used to substitute a redundant row or column of memory cells. The first of these is an "address suppression" technique in which the activation of a row or column of memory cells corresponding to a row or column address is suppressed, and a redundant row or column of memory cells is activated instead. The principle problem with this technique results from the need to compare each row or column address received by the memory device with the addresses of defective rows or columns, respectively. Only after the received address had been compared can either the received address (in the event the addressed row or column is not defective) or the redundant address (in the event the addressed row or column is defective) be used to select a row or column of memory cells. The time required to compare the received address to addresses corresponding to defective cells delays the processing of the received address thereby slowing the rate at which memory accesses can be performed.

In a "data suppression" technique, both the addressed row or column and a redundant row or column are addressed with each memory access. While the access is occurring, the received row or column address is compared to the addresses of defective rows or columns. In the event of a match for a read memory access, the data read from the redundant memory cells are routed to a data bus of the memory device. If there is no match, the data read from memory cells corresponding to the received address are routed to a data bus of the memory device. In the event of a match for a write memory access, the data applied to the data bus of the memory device are coupled to the redundant memory cells. If there is no match, the data applied to the data bus of the memory device are coupled to the memory cells corresponding to the received address. While these data suppression techniques can avoid the delays inherent in the above-described address suppression techniques, they are able to do so only for read memory accesses. For write memory accesses, the received data cannot be coupled to the correct memory cells until received addresses have been compared to the addresses of defective memory cells. Furthermore, data suppression techniques can result in a significant increase in circuit size and complexity and therefore increase the cost of memory devices using such techniques.

There is therefore the need for a row or column redundancy method and system that does not require received addresses to be compared with the addresses of defective memory cells each time a row or column address is received.

SUMMARY OF THE INVENTION

A system for repairing defective columns of memory cells includes a column select steering circuit that shifts signals used to select a defective column of memory cells to either a higher numbered column or a lower numbered column. If the column select signal is redirected to a higher numbered column, the column select signals for all higher numbered columns are also redirected to respective higher numbered columns except for the column select signal for the highest numbered column, which is directed to a redundant column. Similarly, if the column select signal is redirected to a lower numbered column, the column select signals for all lower numbered columns are also redirected to respective lower numbered columns except for the column select signal for the lowest numbered column, which is also directed to a redundant column. Two columns can be repaired by shifting the column select signal for one column and all lower numbered columns downwardly, and by shifting the column select signal for the other column and all higher numbered columns upwardly. A swap circuit can be used to switch the direction in which each column select signal is shifted if a first column is initially repaired by shifting the column select signals downwardly and a lower numbered column is subsequently in need of repair, which would also require shifting the column select signals downwardly. Similarly, the swap circuit can be used to switch the direction in which each column select signal is shifted if a first column is initially repaired by shifting the column select signals upwardly and a higher numbered column is subsequently in need of repair. The system and method can also be used to replace defective rows of memory cells with redundant rows of memory cells in substantially the same manner.

DETAILED DESCRIPTION OF THE INVENTION

Figure 1:
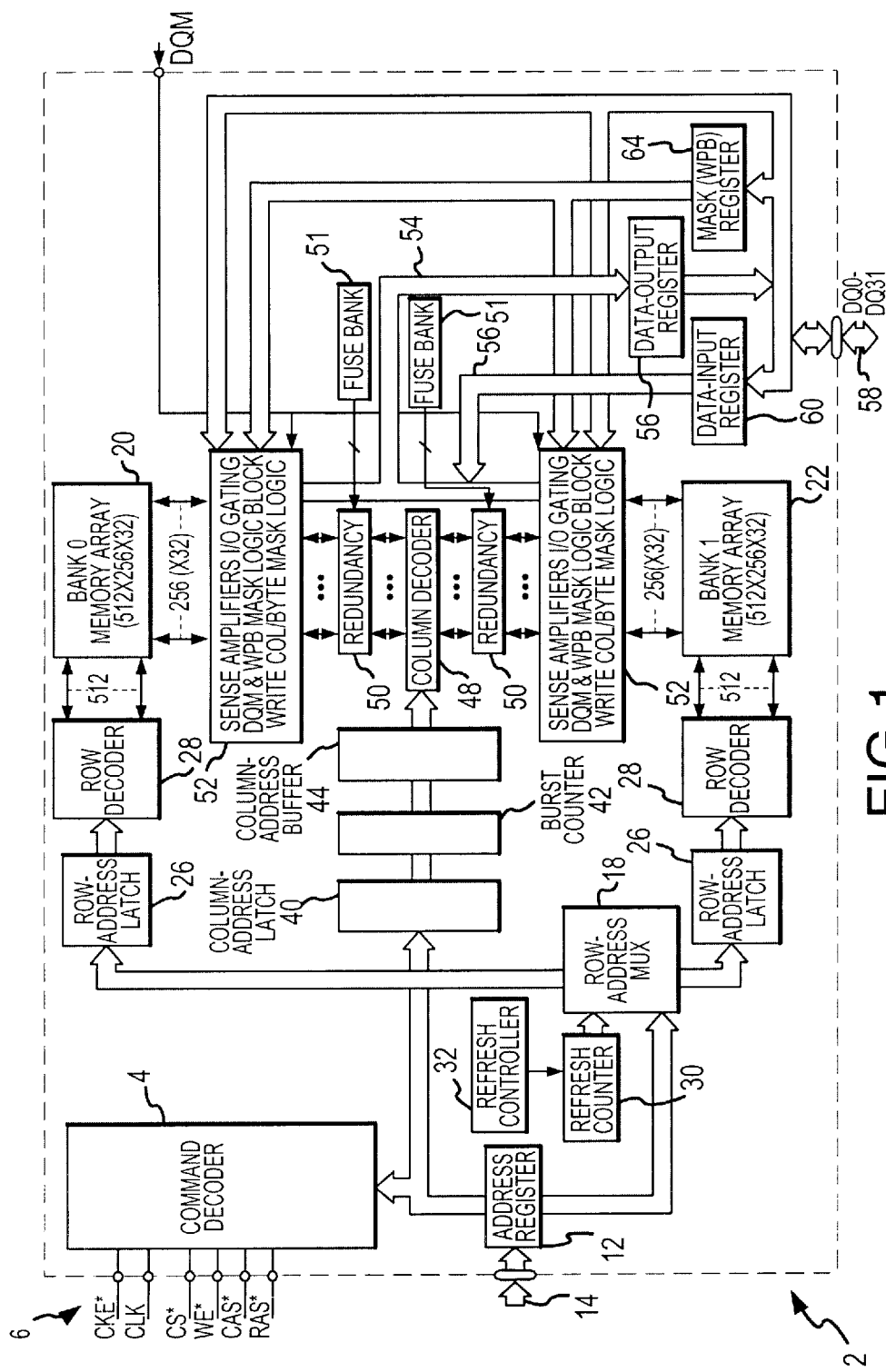
FIG. 1 is a block diagram of a conventional memory device having circuitry for replacing defective columns of memory cells with redundant columns of memory cells.

FIG. 1 is a block diagram of a conventional synchronous dynamic random access memory ("SDRAM") 2 that utilizes a conventional redundant column technique as described above. However, as explained below, the SDRAM 2 can be modified to use redundant column techniques according to various embodiment of the invention, which can also be used with memory devices other than the SDRAM 2.

The operation of the SDRAM 2 is controlled by a command decoder 4 responsive to high-level command signals received on a control bus 6. These high level command signals, which are typically generated by a memory controller (not shown in FIG. 1), are a clock enable signal CKE*, a clock signal CLK, a chip select signal CS*, a write enable signal WE*, a row address strobe signal RAS*, a column address strobe signal CAS*, and a data mask signal DQM, in which the "*" designates the signal as active low. The command decoder 4 generates a sequence of command signals responsive to the high level command signals to carry out the function (e.g., a read or a write) designated by each of the high level command signals. These command signals, and the manner in which they accomplish their respective functions, are conventional. Therefore, in the interest of brevity, a further explanation of these command signals will be omitted.

The SDRAM 2 includes an address register 12 that receives row addresses and column addresses through an address bus 14. The address bus 14 is generally coupled to a memory controller (not shown in FIG. 1). A row address is generally first received by the address register 12 and applied to a row address multiplexer 18. The row address multiplexer 18 couples the row address to a number of components associated with either of two memory banks 20, 22 depending upon the state of a bank address bit forming part of the row address. Associated with each of the memory banks 20, 22 is a respective row address latch 26, which stores the row address, and a row decoder 28, which decodes the row address and applies corresponding signals to one of the arrays 20 or 22. The row address multiplexer 18 also couples row addresses to the row address latches 26 for the purpose of refreshing the memory cells in the arrays 20, 22. The row addresses are generated for refresh purposes by a refresh counter 30, which is controlled by a refresh controller 32. The refresh controller 32 is, in turn, controlled by the command decoder 4.

After the row address has been applied to the address register 12 and stored in one of the row address latches 26, a column address is applied to the address register 12. The address register 12 couples the column address to a column address latch 40. Depending on the operating mode of the SDRAM 2, the column address is either coupled through a burst counter 42 to a column address buffer 44, or to the burst counter 42 which applies a sequence of column addresses to the column address buffer 44 starting at the column address output by the address register 12. In either case, the column address buffer 44 applies a column address to a column decoder 48. The column address from the decoder 48 is applied to a redundancy circuit 50, which also receives one or more column addresses from a fuse bank 51. The fuse bank 51 is programmed by blowing a pattern of fuses or anti-fuses (not shown) that corresponds to one or more column addresses. The column addresses from the fuse bank 51 correspond to respective columns of memory cells in one of the arrays 20, 22 that are defective. In response to receiving each column address from the column decoder 48, the redundancy circuit 50 compares the received column address to the defective column addresses received from the fuse bank 51. In the event there is no match, the redundancy circuit 50 applies various column signals to a sense amplifier and associated column circuitry 54, 55 for a column in one of the respective arrays 20, 22 that corresponds to the received column address. In the event of a match, the redundancy circuit 50 applies the column signals to a sense amplifier and associated column circuitry 54, 55 for the column that corresponds to the a redundant column of memory cells. As mentioned above, it can require considerable time to make this comparison, thereby slowing the operating speed of the SDRAM 2.

Data to be read from one of the arrays 20, 22 is coupled to the column circuitry 54, 55 for one of the arrays 20, 22, respectively. The data is then coupled to a data output register 56. Data to be written to one of the arrays 20, 22 are coupled from the data bus 58 through a data input register 60. The write data are coupled to the column circuitry 54, 55 where they are transferred to one of the arrays 20, 22, respectively. A mask register 64 responds to a data mask DM signal to selectively alter the flow of data into and out of the column circuitry 54, 55, such as by selectively masking data to be read from the arrays 20, 22.

Figure 2:
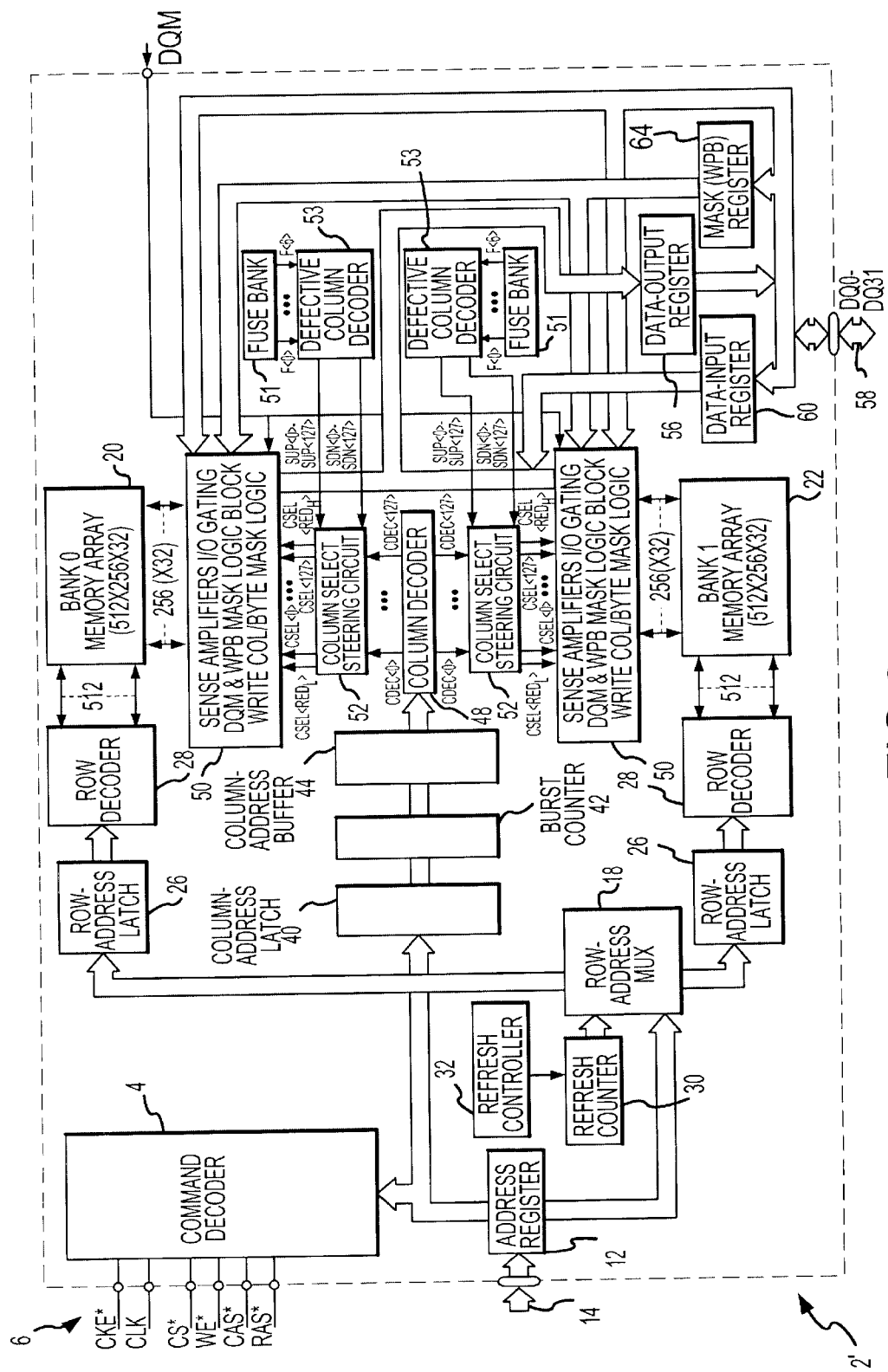
FIG. 2 is a block diagram of a memory device having a system and method for replacing defective columns of memory cells with redundant columns of memory cells according to one embodiment of the present invention.

FIG. 2 is a block diagram of a synchronous dynamic random access memory ("SDRAM") 2' that can utilize a redundant column system and method according to various embodiments of the invention described below. However, it will be understood that various embodiments of the present invention can also be used in other types of DRAMs or other types of memory devices, and embodiments of the invention other than those described herein can be used in the SDRAM 2' or other memory devices. The SDRAM 2' is substantially identical to the SDRAM 2 shown in FIG. 1. Therefore, in the interest of brevity and clarity, an explanation of the topography and operation of the SDRAM 2' will not be repeated. The SDRAM 2' of FIG. 2 differs from the SDRAM 2 of FIG. 1 by using a column select circuit 52 in place of the column redundancy circuit 50 used in the SDRAM 2. The SDRAM 2' does include the fuse bank 51 that outputs column addresses corresponding to defective columns of memory cells. However, rather than applying the column addresses to the redundancy circuit 50 for comparison with column addresses each time they are received, the column addresses from the fuse bank 51 are applied to a defective column decoder 53. The defective column decoder 53 determines the columns corresponding to the column addresses from the fuse bank 51 and outputs an active low shift down signal ("$S_{DN}*$") and an active low shift up signal ("$S_{UP}*$") for each column of memory cells in the arrays 20, 22. In the example shown in FIG. 2, there are 128 columns in each of the arrays 20, 22, so there are 128 $S_{DN}*$ signals and 128 $S_{UP}*$ signals, i.e., $S_{DN}<0>*$ through $S_{DN}<127>*$ and $S_{UP}<0>*$ through $S_{UP}<127>*$ (the "*" indicates the signals are active low). The defective column decoder 53 identifies two defective columns, one of which will be a higher numbered column than the other, e.g., column 56 is a higher numbered column than column 20. The defective column decoder 53 outputs an active shift down $S_{DN}*$ signal for the lower numbered defective column. The defective column decoder 52 also outputs an inactive $S_{DN}*$ signal for the remaining columns. For example, if column 20 is the lower numbered defective column, the defective column decoder 53 will output an active $S_{DN}<20>*$ signal and inactive $S_{DN}<0>*$ through $S_{DN}<19>*$ and $S_{DN}<21>*$ through $S_{DN}<127>*$ signals. Similarly, the defective column decoder 53 outputs an active shift up Sup signal for the higher numbered defective column. The defective column decoder 53 also outputs an inactive $S_{UP}$ signal for the remaining columns. For example, if column 56 is the higher numbered defective column, the defective column decoder 53 will output an active $S_{UP}<56>*$ signal and inactive $S_{UP}<0>*$ through $S_{UP}<55>*$ and $S_{UP}<57>*$ through $S_{UP}<127>*$ signals.

The shift down signals $S_{DN}*$ and shift up signals $S_{UP}*$ from the defective column decoder 53 are applied to the column select circuit 52, which also receives decoded column signals CDec from the column decoder column decoder 48. The column select circuit 52 outputs column select signals CSel for each column of memory cells as well as for two redundant columns of memory cells.

In operation, the column select circuit 52 outputs an active column select signal CSel that is numbered one less than any active decoded column signal CDec if the active decoded column signal is for the lower numbered defective column or any column lower numbered than such column. For example, if column 20 is again the lower numbered defective column, the column select circuit 52 will output an active column select signal CSel<N-1> for any active decoded column signal CDec<N>, where N is equal or less than 20. Thus, if CDec<20> is active because a column address corresponding to column 20 is received, the column select circuit 52 will output an active Csel<19> signal. If CDec<9> is active, the column select circuit 52 will output an active Csel<8> signal. If If CDec<0> is active, the column select circuit 52 will output an active Csel<$RED_L$> signal to select a first redundant column of memory cells. In this manner, a decoded column signal CDec selecting a defective column of memory cells is redirected to the next lower numbered column (or to the redundant column), as are all decoded column signals CDec that select a column that is lower numbered than the defective column.

The column select circuit 52 operates in a similar manner to redirect a decoded column signals CDec that select the defective higher numbered column and each decoded column signals CDec that selects a column that is higher numbered than the defective column. More specifically, the column select circuit 52 outputs an active column select signal CSel that is numbered one greater than any active decoded column signal CDec if the active decoded column signal is for the higher numbered defective column or any column higher numbered than such column. For example, if column 56 is the higher numbered defective column, the column select circuit 52 will output an active column select signal CSel<N+1> for any active decoded column signal CDec<N>, where N is equal or greater than 56. If CDec<127> is active, the column select circuit 52 will output an active Csel<$RED_H$> signal to select a second redundant column of memory cells.

The column select circuit 52 does not redirect decoded column signals CDec that select a column that is higher numbered than the defective lower numbered column and is lower numbered than the defective higher numbered column. For example, if column 20 is the lower numbered defective column and column 56 is the higher numbered defective column, the column select circuit 52 will output an active column select signal CSel<N> for any active decoded column signal CDec<N>, where N is greater than 20 and less than 56, i.e., for CDec between CDec<21> and CDec<55>.

It is important to note that the column select circuit 52 and the defective column decoder 53 do not require that each column address be compared to the defective column addresses output by the fuse bank 51. Instead, the defective column addresses from the fuse bank 51 need only be processed by the defective column decoder 53 once, such as on power-up. The defective column decoder 53 thereafter continuously applies the shift down $S_{DN}$ and shift up $S_{UP}$ signals to the column select circuit 52. The column select circuit 52 then generates the column select signals CSel in real time as the active decoded column signals CDec are received without the need to perform any column address comparisons. As a result, the operating speed of the SDRAM 2' is not degraded by the need to substitute redundant columns of memory cells for defective columns of memory cells.

Although the SDRAM 2' of FIG. 2 uses the fuse bank 51, the defective column decoder 53, and the column select circuit 52 are used to substitute redundant columns of memory cells for defective columns of memory cells, it will be understood that similar circuits in accordance with the present invention can be used to substitute redundant rows of memory cells for defective rows of memory cells. In such case, the fuse bank 51 would provide addresses corresponding to defective rows of memory cells, and a defective row decoder (not shown) and row select steering circuit (not shown) would redirect decoded row signals RDec to activate row select signals RSel.

Figure 3:
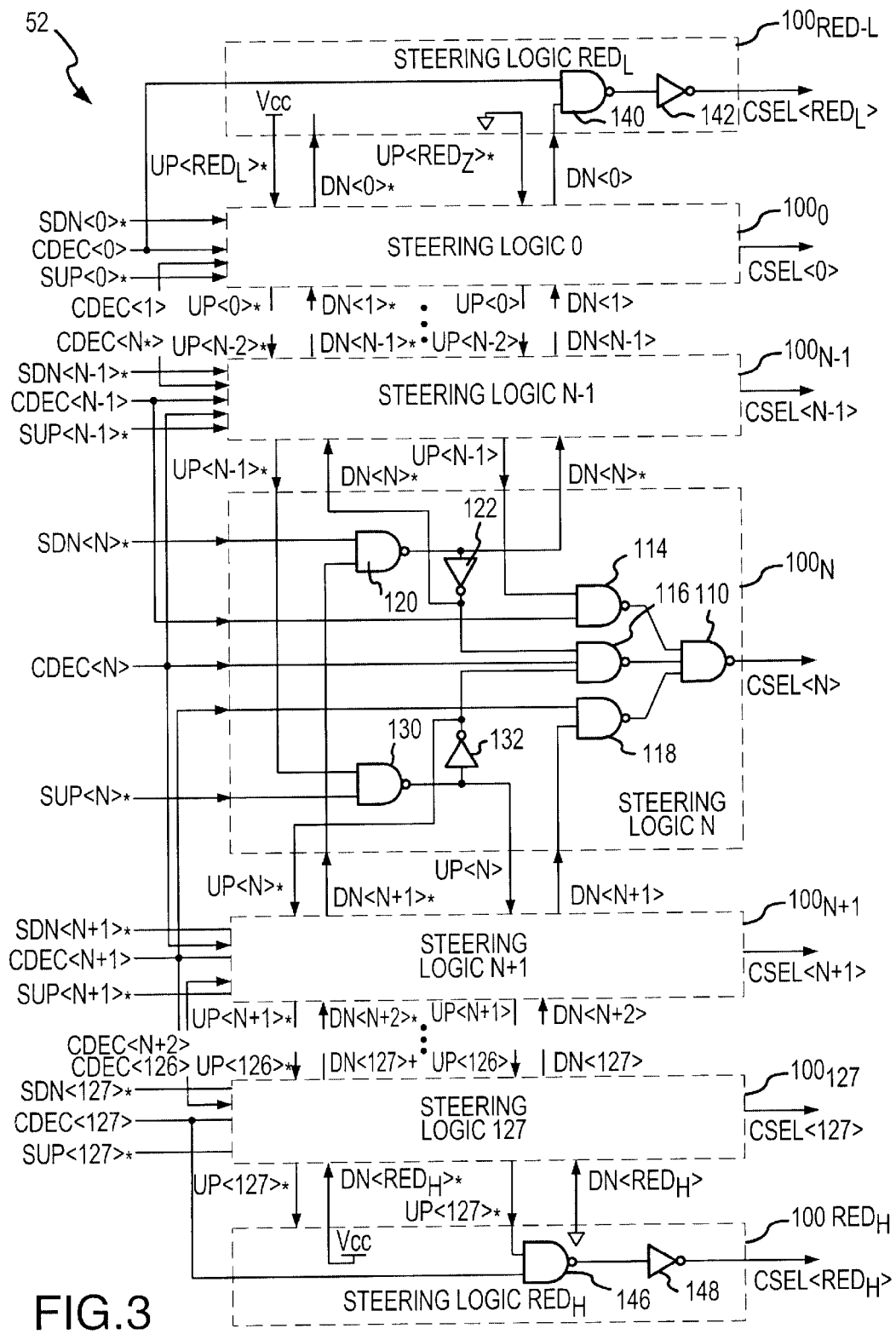
FIG. 3 is a block diagram and logic diagram of one embodiment of a column select steering circuit according to one embodiment of the invention that can be used in the memory device of FIG. 2 or in some other memory device.

One embodiment of the column select circuit 52 is shown in FIG. 3. The column select circuit 52 uses one of 128 steering logic circuits $100_0$–$100_{127}$ for respective columns of memory cells and 2 steering logic circuits $100_{RED-L}$ and $100_{RED-H}$ for each of the two columns of redundant memory cells, respectively. Except for the steering logic circuits $100_{RED-L}$ and $100_{RED-H}$ for the redundant columns, all of the steering logic circuits $100_0$–$100_{127}$ are identical. Therefore, only one of the steering logic circuit $100_N$ is shown in detail in FIG. 3 and will be explained in detail. The column select signal CSel<N> is generated at the output of a NAND gate 110 that has its inputs coupled to the outputs of three NAND gates 114, 116, 118. The NAND gate 114 receives the decoded column signal CDec<N−1> for the next lower numbered column, and is enabled by an active high UP<N−1> signal received from the next lowest numbered steering logic circuit $100_{N-1}$. As explained below, an active high UP signal is generated by each steering logic circuit 100 if the next lowest numbered steering logic circuit 100 receives either an active low shift up signal $S_{UP}$* or an active low UP* signal from the next lowest numbered steering logic circuit 100. As previously explained, the $S_{UP}$<N>* signal will be active low if column N of memory cells is the highest numbered defective column. Thus, if the low shift up signal $S_{UP}$* is active low for any lower numbered steering logic circuit, i.e., steering logic circuit $100_0$ through steering logic circuit $100_{N-1}$, the NAND gate 114 will be enabled. Enabling the NAND gate 114 couples the decoded column signal CDec<N−1> for the next lower numbered column to the input of the NAND gate 110. The NAND gate 110 then outputs the decoded column signal CDec<N−1> as the column select signal CSel<N>. In this manner, each steering logic circuit $100_{N-1}$ outputs a column select signal CSel corresponding to the decoded column signal CDec for the next lowest numbered column in the event the steering logic circuit 100 or any lower numbered steering logic circuit 100 receives an active low shift up signal $S_{UP}$*. For the example shown in FIG. 3, the steering logic circuit $100_N$ outputs the column select signal CSel<N> corresponding to the decoded column signal CDec<N−1> in the event the steering logic circuit 100N or any lower numbered steering logic circuit $100_0$–$100_{N-1}$ receives an active low shift up signal $S_{UP}$*.

In a similar manner, the NAND gate 118 is enabled to couple the decoded column signal CDec<N+1> for to the next highest column in the event the steering logic circuit $100_N$ receives an active high DN<N+1> signal from the next highest numbered steering logic circuit $100_{N+1}$. The DN<N+1> signal will be active high if the next highest numbered steering logic circuit $100_{N+1}$ receives either an active low shift down signal $S_{DN}$* or an active low DN* signal from the next highest numbered steering logic circuit 100. As also previously explained, the $S_{DN}$<N>* signal will be active low if a column N of memory cells is the lower numbered defective column. Thus, if the low shift down signal $S_{DN}$* is active low for any higher numbered steering logic circuit, i.e., steering logic circuit $100_{N+1}$ through steering logic circuit $100_{127}$, the NAND gate 118 will be enabled. The NAND gate 110 will then output the decoded column signal CDec<N+1> as the column select signal CSel<N>. Each steering logic circuit 100 thus outputs a column select signal CSel corresponding to the decoded column signal CDec for the next highest numbered column in the event the steering logic circuit 100 or any higher numbered steering logic circuit 100 receives an active low shift down signal $S_{DN}$*.

The NAND gate 116 receives the decoded column signal CDec<N> for its own column. When enabled, the NAND gate 116 couples the CDec<N> signal through the NAND gate 10 to generate the CSel<N> signal. As explained in greater detail below, the NAND gate 116 is enabled whenever none of the lower numbered steering logic circuits $100_0$–$110_{N-1}$ have received an active low shift up signal $S_{UP}$* and none of the higher numbered steering logic circuits $100_{N+1}$–$110_{127}$ have received an active low shift down signal $S_{DN}$*. In such case, the steering logic circuit $100_N$ outputs a column select signal CSel<N> corresponding to the decoded column signal CDec<N> for its own column.

With further reference to FIG. 3, the shift down signal $S_{DN}$<N>* from the defective column decoder 53 is applied to a NAND gate which also receives an active low DN<N+1>* signal received from the next highest numbered steering logic circuit $100_{N+1}$. The $S_{DN}$<N>* signal will be active low if column N of memory cells is the lower numbered defective column, and the DN<N+1>* signal will be active low if any higher numbered column is the lowest numbered defective column, i.e., if any of the columns N+1 through 127 is the lowest numbered defective column. The DN<N> signal at the output of the NAND gate 120 is applied to the next lowest steering logic circuit $100_{N-1}$ for processing in the same manner as the steering logic circuit $100_N$ processes the DN<N+1> signal, as previously explained. The DN<N> signal at the output of the NAND gate 120 is also coupled through an inverter 122 to generate a complimentary DN<N>* signal, which is applied to the next lowest steering logic circuit $100_{N-1}$ and one input of the NAND gate 116. The steering logic circuit $100_{N-1}$ processes the DN<N>* signal in the same manner that the steering logic circuit 100N processes the DN<N+1>* signal, as previously explained. Basically, an active low DN<N+1>* signal is generated whenever an active low shift down signal $S_{DN}$* for the column N or a higher numbered column N through 127 is generated. This occurs whenever the column N or a higher numbered column N through 127 is the higher numbered defective column. The active low DN<N+1>* signal causes all of the lower numbered steering logic circuits $100_0$ through $100_{N+1}$ to generate active low DN signals, so that each lower numbered steering logic circuits $100_0$ through $100_{N+1}$ generates its column select signal CSel from the decoded column signal CDec for the next higher numbered column. The active low DN<N>* signal is also applied to the NAND gate 116 to disable the gate 116 from coupling the CDec<N> signal to the NAND gate 100, since the CSel<N> signal is generated from the CDec<N+1> signal, as explained above.

The $S_{UP}$<N>* signal from the from the defective column decoder 53 is processed by a NAND gate 130 and inverter 132 in a similar manner in the event the CSel<N> signal is to be generated from the decoded column signal CDec<N−1> for the next lowest column. More specifically, the NAND gate 130 will generate an active high UP<N> signal and an active low UP<N>* signal whenever either the $S_{UP}$<N>* signal is active low or an UP<N−1>* signal received from the next lowest numbered steering logic circuit $100_{N-1}$ is active low. The $S_{UP}$<N>* signal is active low if column N is the lower numbered defective column, and the UP<N−1>* is active low if any of the lower numbered columns is the lower numbered defective column. Thus, the UP<N> signal is active high and the UP<N>* signal is active low if any of the columns 0 though N−1 is the lower numbered defective column.

The UP<N> and UP<N>* signals are applied to the next highest numbered steering logic circuit $100_{N+1}$, which processes the signal in the same manner as the steering logic circuit $100_N$ processed the UP<N-1> and UP<N-1>* signals, as previously explained. The active low UP<N>* signal is also applied to an input of the NAND gate 116 to disable the gate 116 so that the CSel<N> is not generated from the CDec<N> signal. Instead, if column N is not defective, the CSel<N> is generated from the CDec<N-1> signal.

If the $S_{UP}$<N>*, UP<N-1>, UP<N-1>*, $S_{DN}$<N>, DN<N+1> and DN<N+1>* signals are all inactive, the NAND gate 116 is enabled and the NAND gates 114, 118 are disabled so that the CSel<N> corresponds to the CDec<N> signal.

The steering logic circuits $100_{RED-L}$ and $100_{RED-H}$ for the redundant columns are somewhat similar to the other steering logic circuits $100_0$ through $100_{127}$ except they receive only a single decoded column signal CDec, and do not receive either a shift up signal $S_{UP}$* or a shift down signal $S_{DN}$. The steering logic circuit $100_{RED-L}$ for the lower numbered redundant column includes a NAND gate 140 that receives the decoded column signal CDec<0> for column 0 and the DN<0> signal from the steering logic circuit $100_0$. In the event the DN<0> signal is active high, the NAND gate 140 is enabled so that the CSel<$RED_L$> signal corresponds to the CDec<0> signal after the output is coupled through an inverter 142 to preserve the correct polarity of the CDec<0> signal. If the DN<0> signal is inactive low, the NAND gate 140 is disabled so that the CSel<$RED_L$> signal is held inactive low.

The steering logic circuit $100_{RED-H}$ for the higher numbered redundant column is essentially the same and operates in substantially the same manner as the steering logic circuit $100_{RED-L}$. Specifically, the UP<127> signal and the CDec<127> signal are applied to a NAND gate 146, which generates the CSel<$RED_H$> signal through an inverter 148. When the UP<127> signal is active high, the CSel<$RED_H$> signal corresponds to the CDec<127> signal. Otherwise, the CSel<$RED_H$> is held inactive low.

The column select circuit 52 shown in FIG. 3 uses 2 redundant columns of memory cells. However, it will be understood that the column select circuit 52 can be adapted to redirect a greater number of decoded column signals CDec. For example, if 4 redundant columns were provided, decoded column signals CDec would either not be redirected or be redirected either down 2 columns, down 1 column, up 1 column or up 2 columns.

Figure 4:
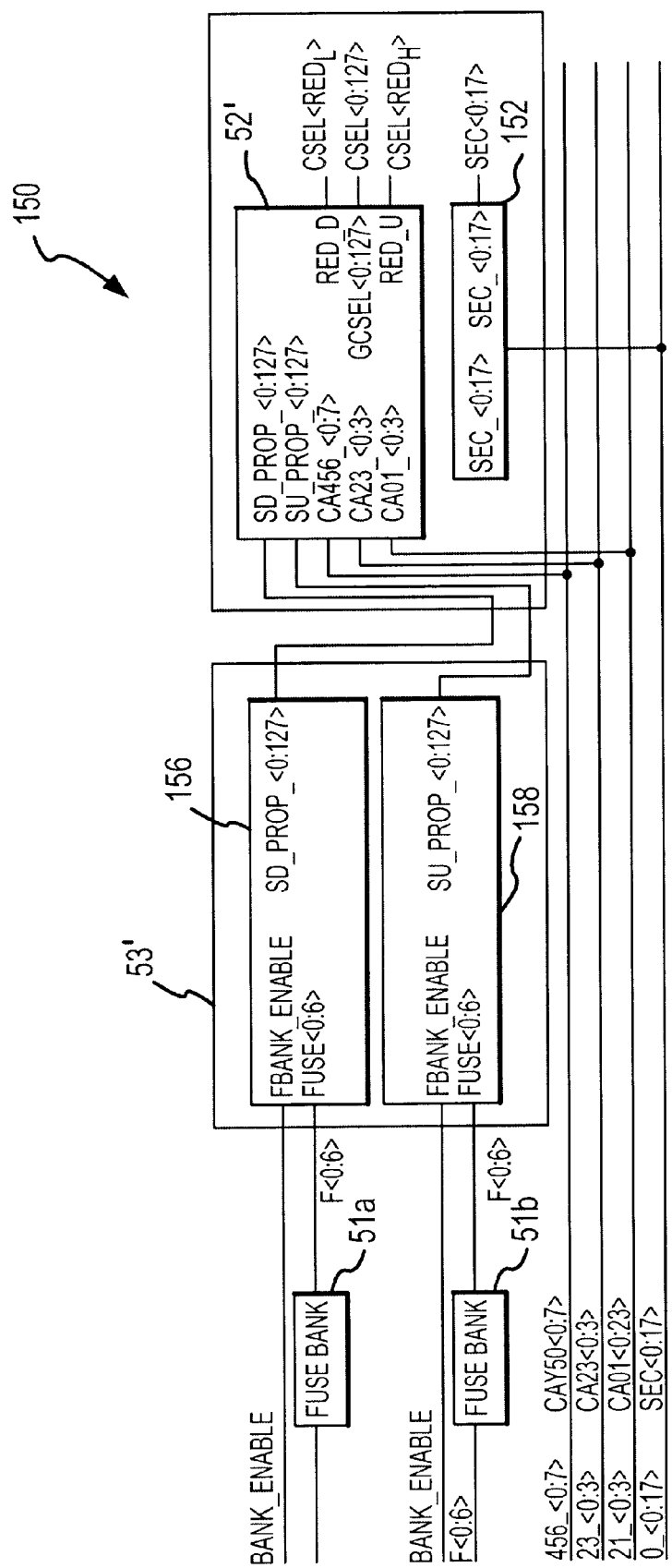
FIG. 4 is a block diagram of a system and method for replacing defective columns of memory cells with redundant columns of memory cells according to another embodiment of the present invention.

Another embodiment of a system 150 and method for replacing for replacing defective columns of memory cells with redundant columns of memory cells is shown in FIG. 4. Like the embodiment of FIG. 2, the system 150 includes a fuse bank 51, a defective column decoder 53' and a column select steering circuit 52'. The system 150 also includes a section decoder circuit 152 that decodes an 18-bit column section address SEC<0:17> and selects a section of memory cells in which a column of memory cells is accessed as selected by a column select signal from the column select steering circuit 52'. The defective column decoder 53' includes a Shift_Down Control Circuit ("SD Circuit") 156 and a Shift_Up Control Circuit ("SU Circuit") 158. The SD Circuit 156 and the SU Circuit 158 receive respective seven bit FD<0:6> and FU<0:6> signals from respective fuse banks 51a,b. In response to respective active high Bank Enable signals, which are conventionally available in the memory device 2', the fuse banks 51 output respective addresses corresponding to defective columns of memory cells. The FD<0:6> signal from the fuse bank 51a identifies a defective column of memory cells for lower numbered columns of memory cells and the FD<0:6> signal from the fuse bank 51b identifies a defective column of memory cells for higher numbered columns of memory cells. In the event the fuse bank 51a outputs an address of a defective column of memory cells, the SD Circuit 156 outputs an active low SD_Prop signal for the defective column identified by the defective column address and active low SD_Prop signal for all lower numbered columns (the "_" indicates a signal that is active low). As explained below, the SD_Prop signals from the SD Circuit 156 cause the column select steering circuit 52' to shift decoded column select signals starting at the defective column one column lower and to activate a redundant column of memory cells in place of the memory cells in column 0. Similarly, if the fuse bank 51b outputs an address of a defective column of memory cells, the SU Circuit 158 outputs an active low SU_Prop signal for the defective corresponding defective column and active low SU_Prop signal for all higher numbered columns. The SU_Prop signals from the SU Circuit 158 cause the column select steering circuit 52' to shift decoded column select signals starting at the defective column one column higher and to activate a redundant column of memory cells in place of the memory cells in column 127.

Figure 5:
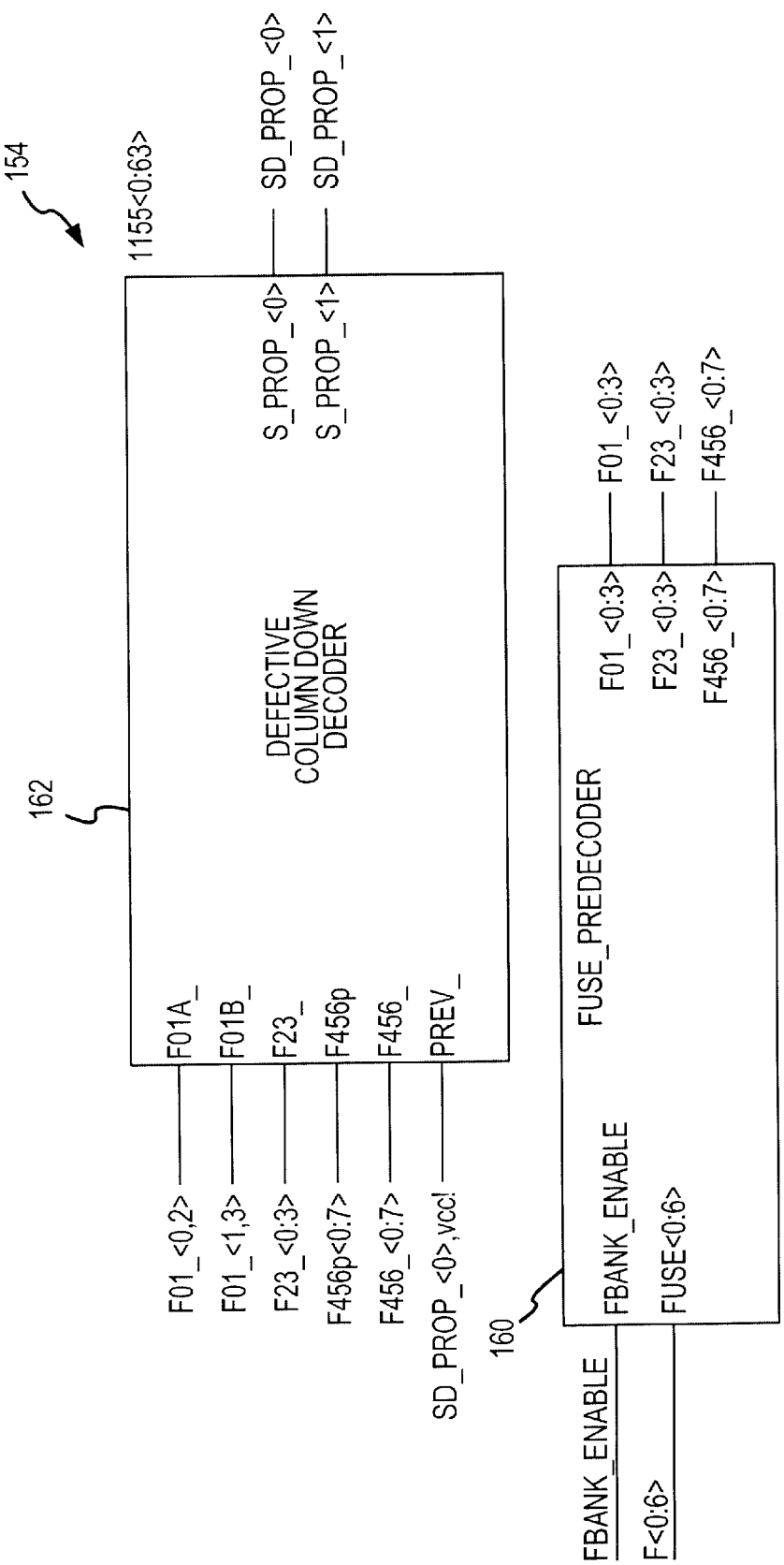
FIG. 5 is a block diagram of a Shift Down Control Circuit according to one embodiment of the invention that can be used in the system and method of FIG. 4.

A block diagram of the SD Circuit 156 is shown in FIG. 5. The SD Circuit 156 includes a Fuse Predecoder 160 and 64 Defective Column Down Decoders 162, i.e., one for every two column of memory cells. The Fuse Predecoder 160 receives a 7-bit FD<0:6> signal from the fuse bank 51. In response to an active low FBank_Enable signal, the Fuse Predecoder 160 outputs a 4-bit F01_<0:3> signal, a 4-bit F23_<0:3> signal, and an 8-bit a 4-bit F456_<0:7> signal that collectively correspond to the address of a defective column of memory cells.

Each of the Defective Column Down Decoders 162 receives the predecoded fuse signals from the Fuse Predecoder 160, although each of the Defective Column Down Decoders 162 decodes these signals in a different way. Each of the Defective Column Down Decoders 162 outputs an SD_Prop<0> signal and an SD_Prop<1> signal that are active low if the corresponding column of memory cells is defective or any higher number column of memory cells is defective. For example, the fourth Defective Column Down Decoder 162 will generate an active low SD_Prop_<0> signal if column 6 or any higher numbered column is defective and an active low SD_Prop_<1> signal if column 7 or any higher numbered column is defective. As explained in greater detail below, each of the Defective Column Down Decoders 162 is able generate active low SD_Prop_<0> and SD_Prop_<1> signals if corresponding columns are defective by decoding the predecoded fuse signals. Each of the Defective Column Down Decoders 162 is also able generate active low SD_Prop_<0> and SD_Prop_<1> signals if any higher numbered column is defective because the SD_Prop_<0> signals from each of the Defective Column Down Decoders 162 for the next highest pair of columns is applied to a Prev_input of each Defective Column Down Decoder 162. However, the Prev_input to the Defective Column Down Decoder 162 for the highest numbered pair of columns is coupled to $V_{CC}$ since there can be no higher numbered defective column. The Defective Column Down Decoders 162 thus collectively output respective active low SD_Prop signals for the defective column and all columns that are lower numbered than the defective column.

Figure 6:
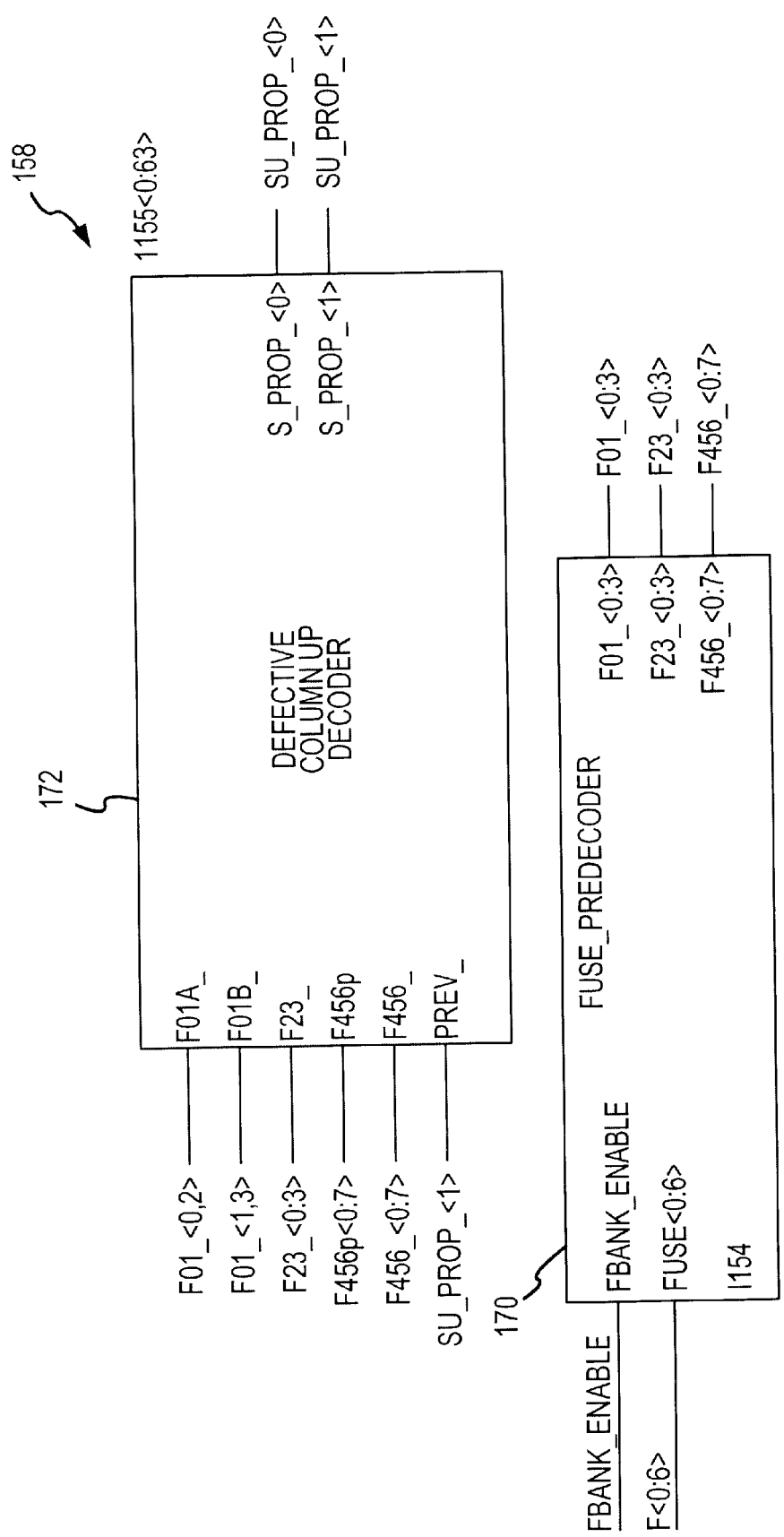
FIG. 6 is a block diagram of a Shift Up Control Circuit according to one embodiment of the invention that can be used in the system and method of FIG. 4.

A block diagram of the SU Circuit 158 is shown in FIG. 6. The SU Circuit 158 is very similar in topography and operation to the SD Circuit 156 of FIG. 5. It also includes a Fuse Predecoder 170, which operates in the same manner as the Fuse Predecoder 160 (FIG. 5), and 64 Defective Column Up Decoders 172, i.e., one for every two column of memory cells. Each of the Defective Column Up Decoders 172 generates an SU_Prop<0> signal and an SU_Prop<1> signal that are active low if the corresponding column of memory cells is defective or any lower number column of memory cells is defective. For example, the 62$^{nd}$ Defective Column Up Decoder 172 will generate an active low SU_Prop_<1> signal if column 123 or any lower numbered column is defective and an active low SU_Prop_<0> signal if column 122 or any lower numbered column is defective. As with the Defective Column Down Decoders 162, each of the Defective Column Up Decoders 172 is able generate active low SU_Prop_<0> and SU_Prop_<1> signals for its corresponding columns by decoding the predecoded fuse signals. Also, each of the Defective Column Up Decoders 172 is also able generate active low SU_Prop_<0> and SU_Prop_<1> signals if any lower numbered column is defective because the SD_Prop_<1> signals from each of the Defective Column Up Decoders 172 for the next lowest pair of columns is applied to a Prev_input of each Defective Column Up Decoder 172. The only exception is for the Defective Column Up Decoder 172 for the lowest numbered pair of columns, which is coupled to $V_{CC}$ since there can be no lower numbered defective column.

Figure 7:
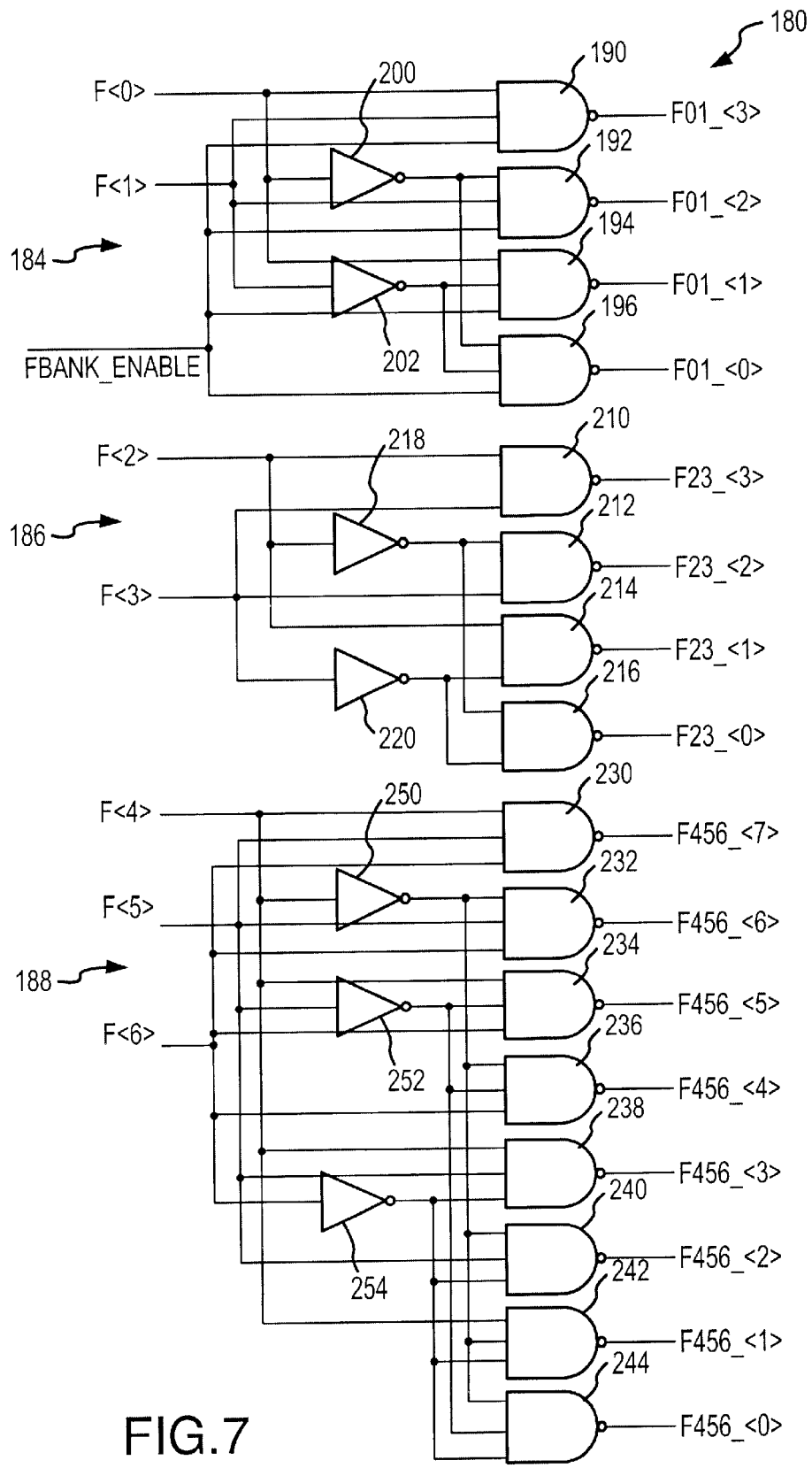
FIG. 7 is a logic diagram of one embodiment of a fuse predecoder that can be used in the Shift Down Control Circuit of FIG. 5 and the Shift Up Control Circuit of FIG. 6.

One embodiment of a fuse predecoder 180 that can be used as the Fuse Predecoders 160, 170 for the SD Circuit 156 and SU Circuit 158 of FIGS. 5 and 6, respectively, is shown in FIG. 7. The fuse predecoder 180 includes a first predecoder section 184 for decoding the first two bits F<0:1> of the defective column address, a second predecoder section 186 for decoding the next two bits F<2:3> of the defective column address, and a third predecoder section 188 for decoding the final three bits F<4:6> of the defective column address. The first predecoder section 184 includes four NAND gates 190–196 and two inverters 200, 202 coupled together so that the predecoded fuse signals F01_<3:1> correspond to the binary value of the first two bits F<0:1> of the defective column address. For example, in response to the active high FBank Enable signal, the NAND gate 196 will generate an active low F01_<0> signal if the F<0> signal and the F<1> signal are both low. Similarly, the NAND gate 190 will generate an active low F01_<3> signal if the F<0> signal and the F<1> signal are both high.

The second predecoder section 186 is identical to the first predecoder section 184 and includes four NAND gates 210–216 and two inverters 218, 220. The second predecoder section 186 operates in the same manner as the first predecoder section 184 to generate predecoded fuse signals F23_<0:3> that correspond to the binary value of bits F<2:3> of the defective column address.

Finally, the third predecoder section 188 includes eight NAND gates 230–244 and three inverters 250–254 to generate predecoded fuse signals F456<0:8> that correspond to the binary value of bits F<4:6> of the defective column address.

Figure 8:
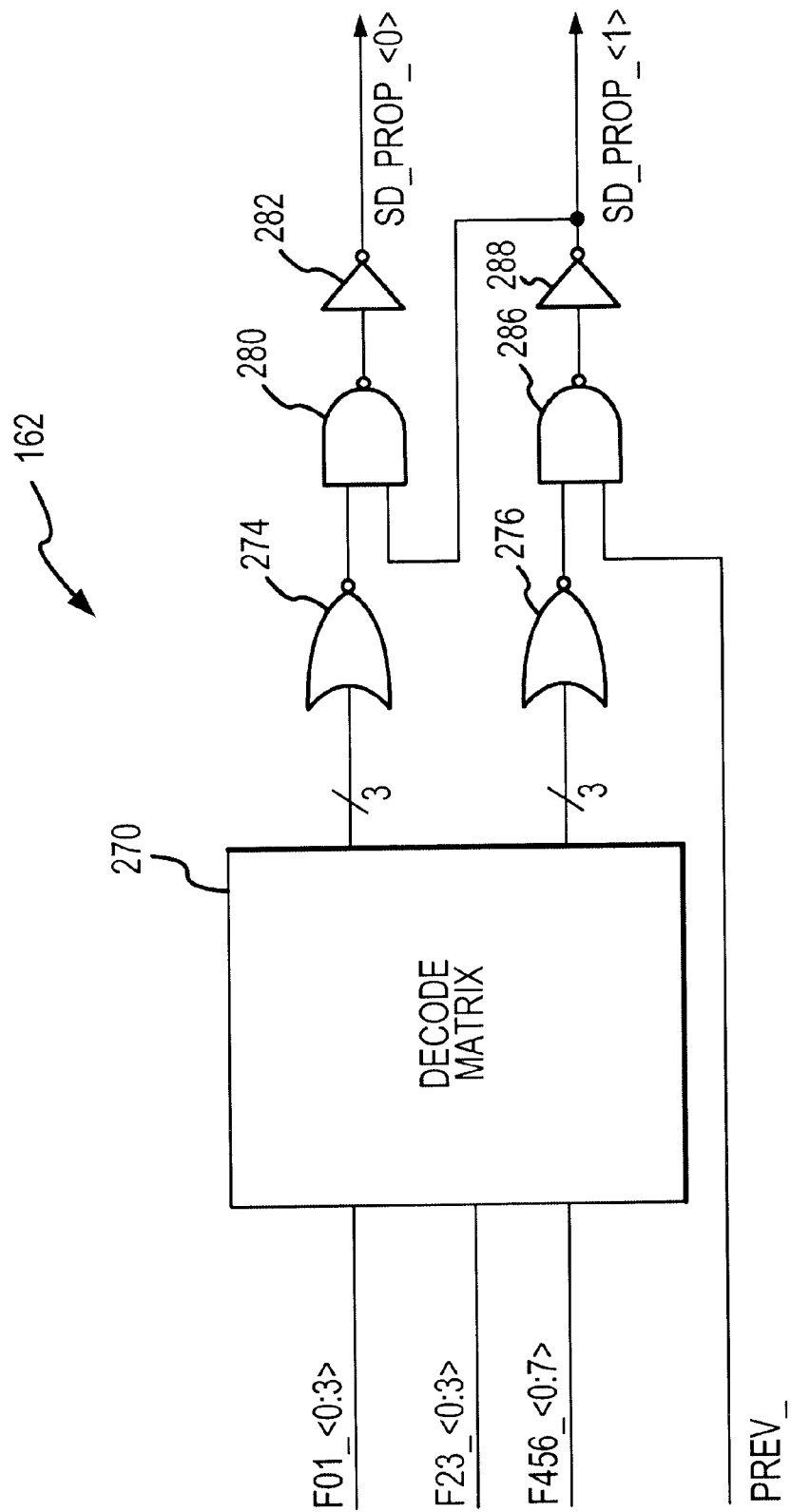
FIG. 8 is a schematic and logic diagram of one embodiment of a Defective Column Decoder that can be used in the Shift Down Control Circuit of FIG. 5.

One embodiment of the 64 Defective Column Down Decoders 162 shown in FIG. 5 is shown in FIG. 8. Each of the Defective Column Down Decoders 162 includes a Decode Matrix 270 receiving the predecoded fuse signals F01_<0:3>, F23_<0:3> and F456_<0:7>, which are coupled to outputs of the Decode Matrix 270. The F01_<0:3>, F23_<0:3> and F456_<0:7> signals are generated by decoding the FD<0:6> signals, as explained above. The 16 outputs of the Decode Matrix 270 are coupled to a pair of NOR gates 274, 276 that decode predetermined combinations of signals from the Decode Matrix 270 depending upon the columns to which each of the Defective Column Down Decoders 162 corresponds. The NOR gates 274, 276 are coupled to Decode Matrix 270 so that the NOR gate 274 decodes outputs from the Decode Matrix 270 that correspond to one column less than the column corresponding to the outputs decoded by the NOR gate 276. For example, in the Defective Column Down Decoder 162 for columns 120 and 121, the NOR gate 274 would receive the F456<7>, F23<2> and F01<0> signals, and the NOR gate 276 would receive the F456<7>, F23<2> and F01<1> signals. In the Defective Column Down Decoder 162 for columns 52 and 53, the NOR gate 274 would receive the F456<3>, F23<1> and F01<0> signals and the NOR gate 276 would receive the F456<3>, F23<1> and F01<1> signals. In this manner, the Decode Matrix 270 and NOR gates 274, 276 decode addresses corresponding to respective defective columns.

The output of the NOR gate 274 is coupled to a NAND gate 280, which also receives the SD_Prop_<1> signal. As mentioned above, the SD_Prop_<1> signal will be active low if any column having a higher number than the column corresponding to the SD_Prop_<0> signal is defective. Thus, the output of the NAND gate 280 will be high to generate an active low SD_Prop_<0> signal at the output of an inverter 282 if either the column corresponding to the SD_Prop_<0> signal is defective (as decoded by the NOR gate 274) or the higher numbered column corresponding to the SD_Prop_<1> signal is defective. The output of the NOR gate 276 is coupled to a NAND gate 286, which also receives a Prev_signal. As explained above, except for the Defective Column Down Decoder 162 for columns 126 and 127, the Prev_signal for each Decoder 162 is coupled to the SD_Prop_<0> signal of the Defective Column Down Decoder 162 for the two next highest numbered columns. Thus, the Prev_signal will be active low if any column having a higher number than the column corresponding to the SD_Prop_<1> signal is defective. The output of the NAND gate 286 will therefore be high to generate an active low SD_Prop_<1> signal at the output of an inverter 288 if either the column corresponding to the SD_Prop_<1> signal is defective or any column having a higher number than the column corresponding to the SD_Prop_<1> signal is defective.

Figure 9:
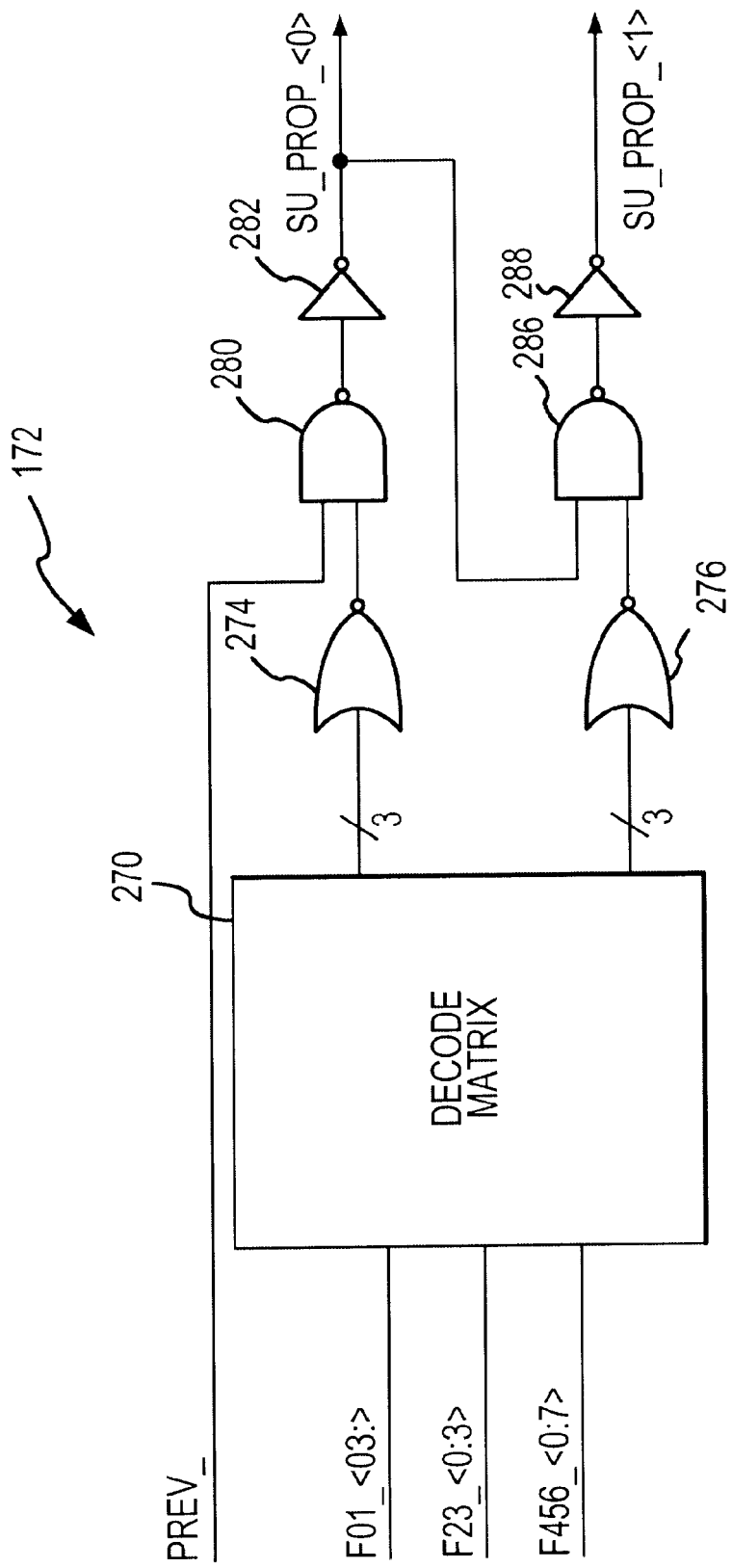
FIG. 9 is a schematic and logic diagram of one embodiment of a Defective Column Decoder that can be used in the Shift Up Control Circuit of FIG. 6.

The Defective Column Up Decoders 172 shown in FIG. 6, which are substantially identical to the Defective Column Down Decoders 162, is shown in FIG. 9. Therefore, in the interest of brevity, the components of the Defective Column Up Decoders 172 have been provided with the same reference numerals as the same components in the Defective Column Down Decoders 162, and a detailed explanation of their operation will not be repeated. The Defective Column Up Decoders 172 differ from the Defective Column Down Decoders 162 by coupling an input to the NAND gate 288 to the SU_Prop_<0> signal rather than to the Prev_signal, and by coupling an input to the NAND gate 280 to the Prev_signal rather than to the SU_Prop_<1> signal. As a result, the SU_Prop_<1> signal will be active low if any column having a higher number than the column corresponding to the SU_Prop_<0> signal is defective. Thus, the output of the NAND gate 288 will be high to generate an active low SU_Prop_<1> signal if either the column corresponding to the SU_Prop_<0> signal is defective (as decoded by the NOR gate 276) or the lower numbered column corresponding to the SU_Prop_<0> signal is defective. The NAND gate 280 is also coupled to the Decode Matrix 270 to generate an active low SU_Prop_<0> signal if the column corresponding to the SU_Prop_<0> signal is defective. However, since the NAND gate 280 also receives the Prev_signal, which is coupled to the SU_Prop_<1> signal from the Defective Column Up Decoder 172 for the next lowest numbered columns, the SU_Prop_<1> signal is also active low if any lower numbered column is defective. The output of the NAND gate 280 will therefore be high to generate an active low SU_Prop_<0> signal if either the column corresponding to the SU_Prop_<0> signal is defective or any column having a lower number than the column corresponding to the SU_Prop_<0> signal is defective.

Figure 10:
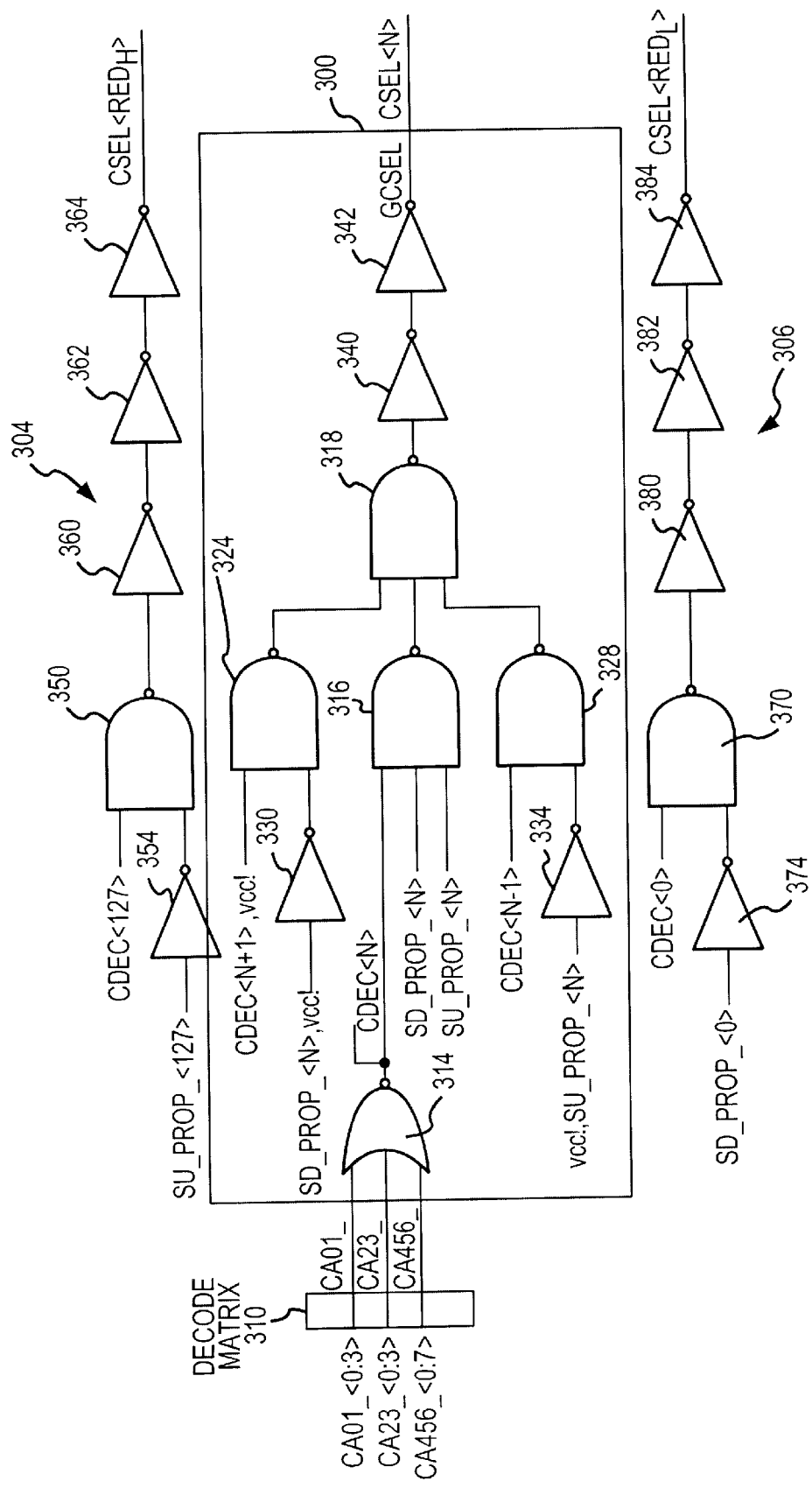
FIG. 10 is a schematic and logic diagram of one embodiment of a column select steering circuit that may be used in the system and method for replacing defective columns of memory cells illustrated in FIG. 4.

One embodiment of the column select steering circuit 52' shown in FIG. 4 is illustrated in FIG. 10. The column select steering circuit 52' includes 128 column select circuits 300, i.e., one for each column, in addition to two redundant column select circuits 304, 306. Each of the column select circuits 300 further decodes predecoded column address signals to generate a column select signal CSEL based on either the decoded column signal CDec<N> for that column or the decoded column signal CDec<N–1> or CDec<N+1> for the next lower or next higher column, respectively. More specifically, 14 bits of the predecoded column address signals CA01<0:3>, CA23<0:3> and CA456<0:7> are applied to a Decode Matrix 310. The Decode Matrix 310 in each of the column select circuits 300 selects the bits of the predecoded column address signals that correspond to the respective column of the column select circuit 300 and apply those bits to a NOR gate 314. When the predecoded column address signals correspond to column for which the column select circuit 300 is provided, the decoded column signal CDec<N> signal at the output of the NOR gate 314 transitions to active high. The output of the NOR gate 314 is applied to a NAND gate 316, which also receives the active low SD_Prop_<N> and SU_Prop_<N> signals. When neither the SD_Prop_<N> signal nor the SU_Prop_<N> signal is active low, the NAND gate 316 is enabled to couple the CDec<N> signal to the input of a NAND gate 318. The NAND gate 318 also receives inputs from two other NAND gates 324, 228. The NAND gate 324 receives the decoded column signal CDec<N+1> signal from the NOR gate 314 of the column select circuit 300 for the next highest numbered column, and the SD_Prop_<N> signal through an inverter 330. When the SD_Prop_<N> signal is active low, the NAND gate 324 is enabled to couple the compliment of the CDec<N+1> signal to the input of the NAND gate 318. Similarly, the NAND gate 328 receives the decoded column signal CDec<N–1> signal from the NOR gate 314 of the column select circuit 300 for the next lowest numbered column, and the SU_Prop_<N> signal through an inverter 334. When the SU_Prop_<N> signal is active low, the NAND gate 328 is enabled to couple the compliment of the CDec<N–1> signal to the input of the NAND gate 318.

In operation, if there is no higher numbered defective column the SD_Prop_<N> signal will be inactive high, and if there is no lower numbered defective column the SU_Prop_<N> signal will be inactive high. Under these conditions, the output of the NAND gate 316 will be low if the decoded column signal CDec<N> signal is high, thus making the output of the NAND gate 318 low. After passing through two inverters 340, 342, the column select signal CSel<N> will be identical to the decoded column signal CDec<N> signal. If the SD_Prop_<N> signal is active low, the NAND gate 316 is disabled and the NAND gate 324 is enabled so that the column select signal CSel<N> will be identical to the decoded column signal CDec<N+1>. Similarly, if the SU_Prop_<N> signal is active low, the NAND gate 316 will be disabled and the NAND gate 328 will be enabled so that the column select signal CSel<N> will be identical to the decoded column signal CDec<N–1> signal. The decoded column signals CDec are therefore either not shifted or they are shifted down or up to generate each column select signal CSel depending on whether the SD_Prop_<N> signal or SU_Prop_<N> signal is active low.

The redundant column select circuit 304 includes a NAND gate 350 that received the decoded column signal CDec<127> for the highest numbered column as well as the SU_Prop_<127> signal through an inverter 354. Since the output of the NAND gate 350 is coupled through three inverters 360, 362, 364, the redundant column select signal CSEL<RED$_H$> will be identical to the decoded column signal CDec<127> whenever the shift up signal SU_Prop_<127> is active low. Thus, the decoded column signal CDec<127> is shifted upwardly to the redundant column.

Similarly, the other redundant column select circuit 306 includes a NAND gate 370 that received the decoded column signal CDec<0> for the lowest numbered column as well as the shift down signal SD_Prop_<0> signal through an inverter 374. Since the output of the NAND gate 370 is also coupled through three inverters 380, 382, 384, the redundant column select signal CSEL<RED$_L$> will be identical to the decoded column signal CDec<0> whenever the shift down signal SD_Prop_<0> is active low. Thus, the decoded column signal CDec<0> is shifted downwardly to the redundant column.

It can now be seen that the embodiment of FIGS. 4–10 differs from the embodiment of FIGS. 2 and 3, inter alia, in the manner is which shift up or shift down signals are coupled from one column to the next. In the embodiment of FIGS. 2 and 3, the defective column decoder 53 generates a shift up or shift down signal only for a defective column. The column select steering circuit 52 then causes the decoded column signals for that column and for all higher or lower numbered columns to be shifted up or down. In contrast, the defective column decoder 53' used in the embodiment of FIGS. 4–10 generates a shift up SU_Prop_ signal or a shift down SD_Prop_signal for not only the defective column, but also for every higher numbered or lower numbered column. The column select steering circuit 52 then shifts each of the decoded column signals only if the corresponding shift up or shift down signal is active.

Figure 11:
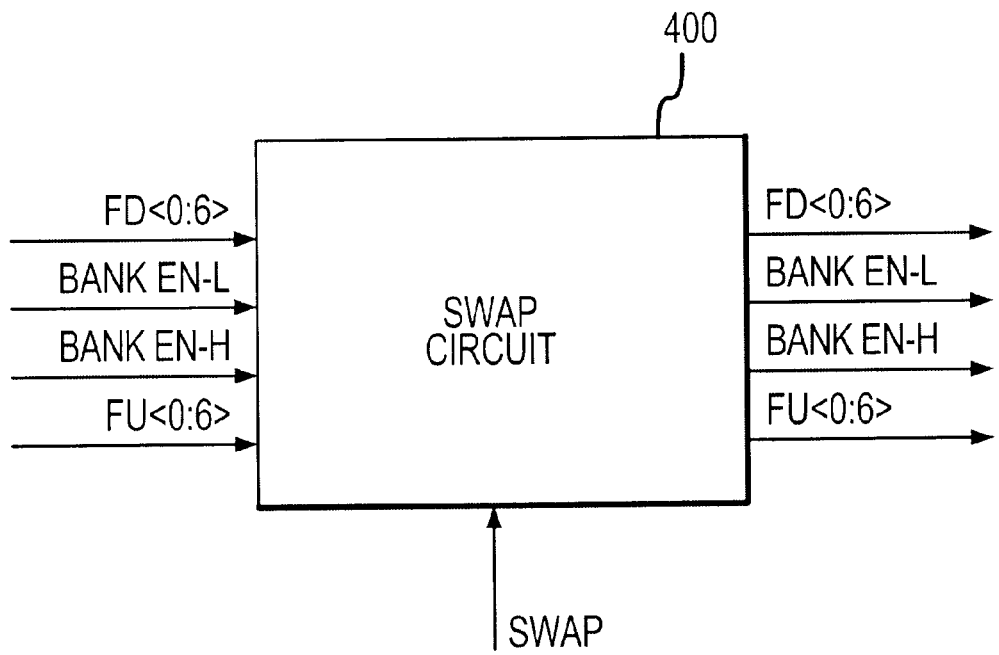
FIG. 11 is a block diagram of one embodiment of a Swap Circuit for reprogramming the defective column repair system and method to allow defective columns to be sequentially repaired.

Although the redundant column system and method embodiments shown in FIGS. 2–10 have a great deal of flexibility in repairing defective columns when two defective columns are repaired at the same time, they can be less flexible if two defective columns are repaired at different time. Consider, for example, the situation where column 82 is found to be defective and repaired by shifting the decoded column signal CDec<82> for that column and all of the decoded column signals CDec<0>–CDec<82> for all lower numbered columns downwardly. If, after column 82 is repaired in that manner, column 40 is later found to be defective, it will not be possible to repair that column. The decoded column signals for column 40 and all lower columns are already being shifted downwardly so it would not be possible to start shifting decoded column signals downwardly by two columns starting at column 40 (although, as explained above, embodiments of the invention could be devised to shift decoded column signals downwardly or upwardly by any number of columns). Further, it would not be possible to start shifting decoded column signals upwardly starting at column 40 because the decoded column signals for columns 41–82 are already being shifted downwardly. To solve this problem, a redundant column system and method according to the present invention may include a Swap Circuit 400 as shown in FIG. 11. As mentioned above, the lowest numbered defective column is repaired by programming the FD fuse bank 51a with the address of such column, and the highest numbered defective column is repaired by programming the FU fuse bank 51b with the address of such column. In accordance with one embodiment of the invention, the FD<0:6> and FU<0:6> signals are coupled through the Swap Circuit 400 before being coupled to the defective column decoders 53, 53'. The Swap Circuit 400 functions to swap the FD<0:6> signals for the FU<0:6> signals and vice-versa responsive to a SWAP control signal. The Swap Circuit 400 also swaps the fuse bank enable signals for the fuse bank 51a for the fuse bank enable signals for the fuse bank 51b, and vice-versa. The SWAP control signal may be generated for example, by programming a fuse or a mode register when a second defective column is repaired after a first defective column has been repaired. Thereafter, the FD<0:6> signals are applied to defective column decoders 53, 53' for generating the shift up signals, and the FU<0:6> signals are applied to defective column decoders 53, 53' for generating the shift down signals. Using the above example, again assume column 82 is found to be defective and repaired by shifting the decoded column signal CDec<82> for that column and all of the decoded column signals CDec<0>–CDec<82> for all lower numbered columns downwardly. To accomplish that repair, the FD fuse bank 51b is programmed so that FD<0:6> is equal to 82. As explained above, if column 40 was later found to be defective, it would not be possible to repair that column by programming the FU fuse bank 51a so that FU<0:6> is equal to 40. However, using the Swap Circuit 400, the FU fuse bank 51a is programmed so that FU<0:6> is equal to 40, and the Swap Circuit 400 effectively makes FU<0:6> equal to 82 and FD<0:6> equal to 40. As a result, the decoded column signals CDec<0> through CDec<40> will be shifted downwardly to generate the CSEL<RED$_L$> and CSEL<0> through CSEL<39> signals, the decoded column signals CDec<82> through CDec<127> will be shifted upwardly to generate the CSEL<83> through CSEL<127> signals and CSEL<RED$_H$> signal, and the decoded column signals CDec<41> through CDec<81> will not be shifted at all to generate the CSEL<41> through CSEL<81> signals.

Figure 12:
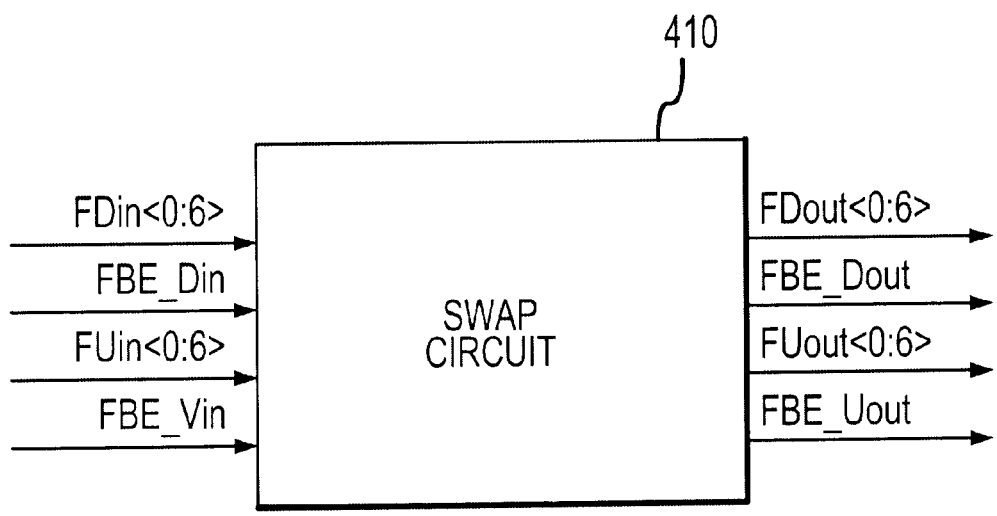
FIG. 12 is a block diagram of another embodiment of a Swap Circuit for reprogramming the defective column repair system and method to allow defective columns to be sequentially repaired.
Figure 13:
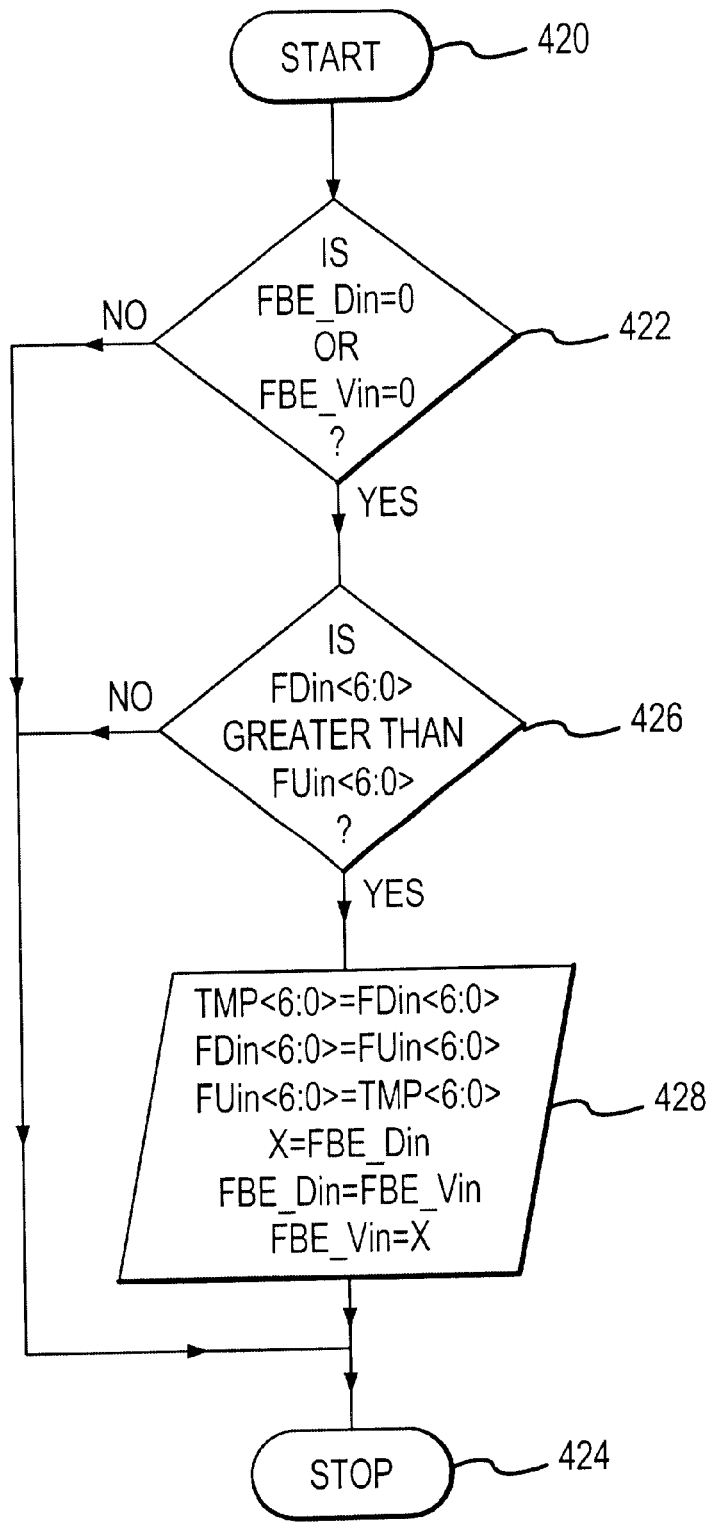
FIG. 13 is a flow chart showing the operation of the Swap Circuit of FIG. 12

Another embodiment of a Swap Circuit 410 is illustrated in Figure 12. The Swap Circuit 410 implements the flow chart shown in FIG. 13 either using hard-wired logic circuitry or by programming a processor. The process starts at step 420, and a decision is then made at 422 whether both of the Bank Enable signals FBE_Uin and FBE_Din for the respective fuse banks 51a,b, respectively, are active. If not (i.e., both FBE_Uin and FBE_Din signals are active high), there is mast only one bad column and thus there is no need to swap FU<0:6> and FD<0:6>. Therefore, the process jumps to a stop 424.If both of the Bank Enable signals FBE_Uin or FBE_Din are found to active at step 422, the process progresses to step 426 where a determination is made whether the shift down fuse signals FD<6:0> have a value that is greater than the value of the FD<6:0>. If not, the fuse signals have their proper relationship to each other, and the process jumps to the stop 424. If it is determined at step 426 that the shift down fuse signals FD<6:0> have a value that is greater than the value of the FD<6:0>, the fuse signals must be swapped, and this is accomplished at step 428. More specifically, at step 428 a temporary 7-bit code TMP<0:6> is set equal to the shift down fuse signals FD<0:6>the shift down fuse signals FD<0:6> are then set to be equal to the shift up fuse signals FU<0:6>. At this point, the shift up fuse signals FU<0:6> have the proper value to repair the higher numbered defective column. The shift down fuse signals FD<0:6> are then set equal to the temporary 7-bit code TMP<0:6> so they also now have the proper value to repair the lower numbered defective column. However, it is also necessary to swap the fuse bank enable signals FBE_Uin or FBE_Din. This is accomplished by setting a temporary variable "x" to FBE_Din, setting FBE_Din equal to FBE_Uin and then setting FBE_Uin equal to the temporary variable x. Thereafter, the Swap Circuit 420 will effectively make FBE_Uin equal to the previous FBE_Din, FBE_Din equal to the previous FBE_Uin, make FBE_Din equal to the previous FBE_Uin, and make FBE_Uin equal to the previous FBE_Din.

Figure 14:
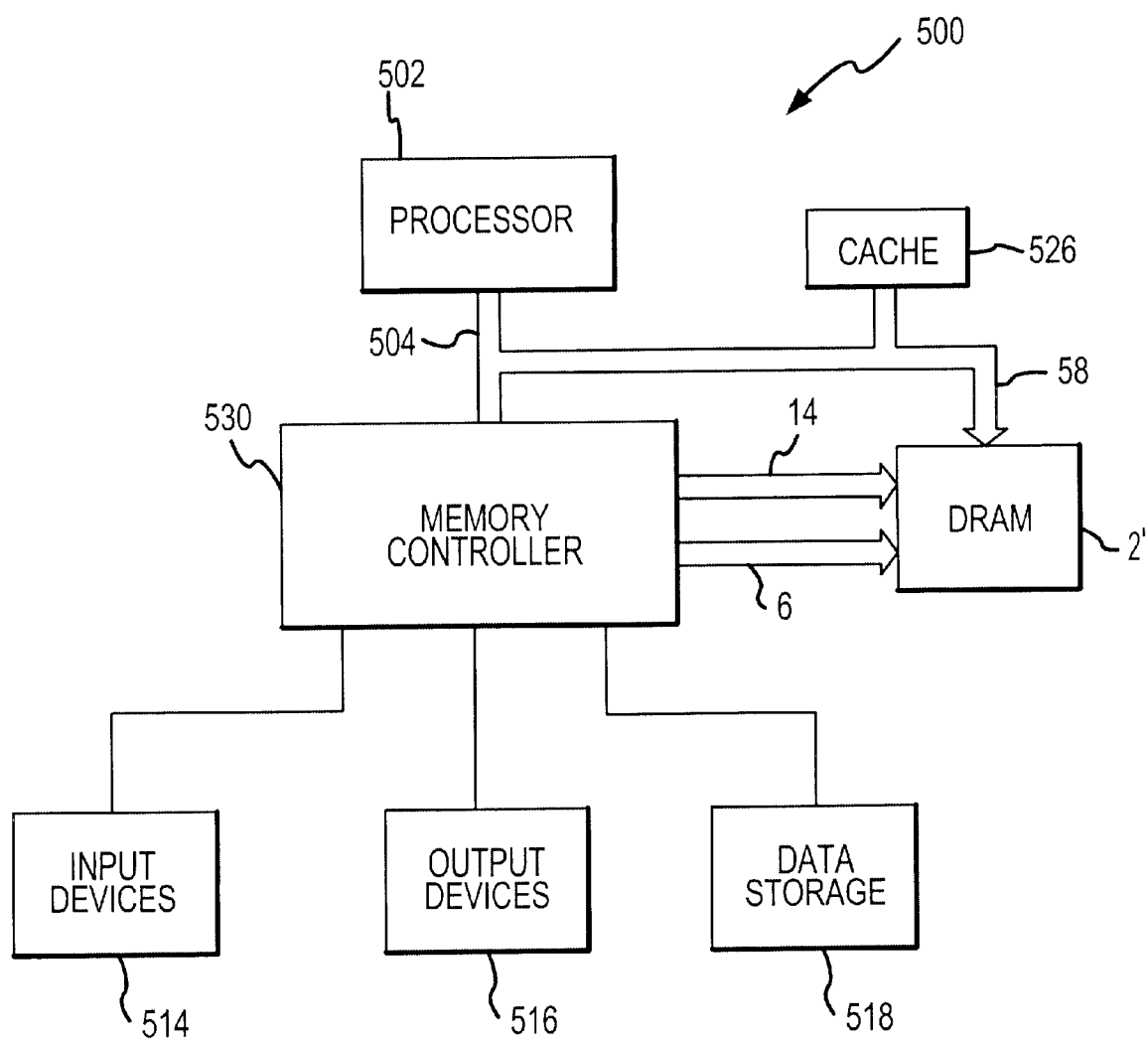
FIG. 14 is a block diagram of a computer system that includes the memory device of FIG. 2 containing a system for repairing defective columns of memory cells in accordance with the present invention.

FIG. 14 shows an embodiment of a computer system 500 that may use the SDRAM 2' or some other memory device that used one of the embodiments of a defective column replacement circuit described above or some other embodiment of the invention. The computer system 500 includes a processor 502 for performing various computing functions, such as executing specific software to perform specific calculations or tasks. The processor 502 includes a processor bus 504 that normally includes an address bus, a control bus, and a data bus. In addition, the computer system 500 includes one or more input devices 514, such as a keyboard or a mouse, coupled to the processor 502 to allow an operator to interface with the computer system 500. Typically, the computer system 500 also includes one or more output devices 516 coupled to the processor 502, such output devices typically being a printer or a video terminal. One or more data storage devices 518 are also typically coupled to the processor 502 to store data or retrieve data from external storage media (not shown). Examples of typical storage devices 518 include hard and floppy disks, tape cassettes, and compact disk read-only memories (CD-ROMs). The processor 502 is also typically coupled to a cache memory 526, which is usually static random access memory ("SRAM") and to the SDRAM 2' through a memory controller 530. The memory controller 530 includes an address bus coupled to the address bus 14 (FIG. 2) to couple row addresses and column addresses to the DRAM 2'. The memory controller 530 also includes a control bus that couples command signals to a control bus 6 of the SDRAM 2'. The external data bus 58 of the SDRAM 2' is coupled to the data bus of the processor 502, either directly or through the memory controller 530.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A system for selecting redundant sets of memory cells, comprising
    a programmable circuit that is programmed to output an address corresponding to a defective set of memory cells;
    a defective memory cell decoder coupled to receive the address from the programmable circuit, the defective memory cell decoder outputting at least one shift control signal corresponding to the address from the programmable circuit, the at least one shift control signal indicating a shift direction for a select signal for the defective set corresponding to the address; and
    a select signal steering circuit coupled to receive the at least one shift control signal from the defective memory cell decoder, the select signal steering circuit being operable to shift in the direction indicated by the shift control signal the select signal for the defective set to an adjacent set of memory cells, to shift in the direction indicated by the at least one shift control signal the select signal for one of the sets to a redundant set of memory cells, and to shift in the direction indicated by the at least one shift control signal respective select signals for the sets intermediate the defective set and the one set to respective adjacent sets of memory cells.

2. The system of claim 1 wherein each of the sets of memory cells comprises a respective column of memory cells.

3. The system of claim 1 wherein the defective memory cell decoder is operable to output a shift control signal indicating a shift direction for only the select signal for the defective set, and wherein the select signal steering circuit is operable to shift the select signal for the defective set and the select signals for the remaining sets that are shifted responsive to the one shift control signal.

4. The system of claim 3 wherein the select signal steering circuit comprises a plurality of logic circuits corresponding in number to the number of sets of memory cells, each of the logic circuits receiving the select signal for the respective set and a shift signal from the logic circuit for an adjacent set of memory cells, the shift signal indicating that the select signal for the adjacent set is being shifted, each of the logic circuits being operable to output the select signal for the adjacent set responsive to receiving either the shift control signal for the respective set or the shift signal from the logic circuit for the adjacent set, and being operable to output the select signal for the respective set in the absence of receiving either the shift control signal for the respective set or the shift signal from the logic circuit for the adjacent set.

5. The system of claim 4 wherein the select signal steering circuit further comprises a logic circuit corresponding to the redundant set of memory cells, the logic circuit corresponding to the redundant set receiving the select signal for an adjacent column and a shift signal from the logic circuit for the adjacent column of memory cells, the shift signal indicating that the select signal for the adjacent set is being shifted, the logic circuit corresponding to the redundant set being operable to output the select signal for the adjacent set to the redundant set responsive to receiving the shift signal from the logic circuit for the adjacent set.

6. The system of claim 1 wherein the defective memory cell decoder is operable to output a shift control signal indicating a shift direction for the select signal for the defective set, and to output respective shift control signals indicating a shift direction for respective select signals for the remaining sets that are to be shifted, and wherein the select signal steering circuit is operable to shift each of the select signals responsive to the respective ones of the shift control signals received from the defective memory cell decoder.

7. The system of claim 6 wherein the defective memory cell decoder comprises an address decoder for each of the sets of memory cells, each of the address decoders being operable to decode the address from the programmable circuit and to output the shift control signal responsive to decoding an address corresponding to the respective set.

8. The system of claim 7 wherein the select signal steering circuit comprises a plurality of logic circuits corresponding in number to the number of sets of memory cells plus the number of redundant sets of memory cells, each of the logic circuits comprising a first logic gate having an input receiving the select signal for the respective set and a second logic gate receiving the select signal for a set adjacent the respective set, the logic gates further receiving respective shift control signals that are operable to enable the first logic gate if the select signal for the respective set is not to be shifted and to enable the second logic gate if the select signal for the respective set is to be shifted.

9. The system of claim 1 wherein:

the programmable circuit comprises a first circuit that may be programmed to output a first address corresponding to a first defective set of memory cells and a first shift direction, and a second circuit that may be programmed to output a second address corresponding to a second defective set of memory cells and a second shift direction that is opposite the first shift direction;

wherein the defective memory cell decoder is operable to output a first shift control signal corresponding to the first address, and a second shift control signal corresponding to the second address; and wherein the select signal steering circuit is operable responsive to the first shift control signal to shift in the first direction the select signal for the first defective set to an adjacent set, to shift in the first direction the select signal for one of the sets to a first redundant set of memory cells, and to shift in the first direction respective select signals for the sets intermediate the first defective set and the first redundant set to respective adjacent sets of memory cells, and wherein the select signal steering circuit is further operable responsive to the second shift control signal to shift in the second direction the select signal for the second defective set to an adjacent set, to shift in the second direction the select signal for one of the sets to a second redundant set of memory cells, and to shift in the second direction respective select signals for the sets intermediate the second defective set and the second redundant set to respective adjacent sets of memory cells.

10. The system of claim 9, further comprising a swap circuit coupled between the programmable circuit and the defective memory cell decoder, the swap circuit being operable in a first mode to couple the first address to a first output and a second address to a second output, and being operable in a second mode to couple the first address to the second output and the second address to the first output.

11. A system for selecting redundant columns of memory cells, comprising a programmable circuit comprising a first circuit that may be programmed to output a first defective column address corresponding to a first defective column of memory cells, and a second circuit that may be programmed to output a second defective column address corresponding to a second defective column of memory cells;

a defective column decoder coupled to receive the first and second defective column addresses from the programmable circuit, the defective column decoder being operable to output a first shift control signal corresponding to the first defective column address and to a first shift direction, and a second shift control signal corresponding to the second defective column address and a second shift direction that is opposite the first shift direction; and a column select steering circuit coupled to receive the first and second shift control signals from the defective column decoder, the column select steering circuit being operable responsive to the first shift control signal to shift in the direction indicated by the first shift control signal the select signal for the first defective column to an adjacent column of memory cells, to shift in the first direction the select signal for one of the columns to a first redundant column of memory cells, to shift in the first direction respective select signals for the columns intermediate the first defective column and the first redundant column to respective adjacent columns of memory cells, and wherein the select signal steering circuit is further operable responsive to the second shift control signal to shift in the second direction the select signal for the second defective column to an adjacent column of memory cells, to shift in the second direction the select signal for one of the columns to a second redundant set of memory cells, and to shift in the second direction respective select signals for the columns intermediate the second defective column and the second redundant column to respective adjacent sets of memory cells.

12. The system of claim 11 wherein the column select steering circuit is operable to leave unshifted the select signals for the columns of memory cells intermediate the first defective column and the second defective column.

13. The system of claim 11 wherein the defective memory cell decoder is operable to output respective shift control signals indicating a shift direction for only the select signals for the defective columns, and wherein the select signal steering circuit is operable to shift the select signal for the defective columns and the select signals for the remaining columns that are shifted responsive to the shift control signals for the defective columns.

14. The system of claim 13 wherein the select signal steering circuit comprises a plurality of logic circuits corresponding in number to the number of columns of memory cells, each of the logic circuits receiving the select signal for the respective column and a shift signal from the logic circuit for an adjacent column of memory cells, the shift signal indicating that the select signal for the adjacent column is being shifted, each of the logic circuits being operable to shift the select signal for the respective column responsive to receiving either the shift control signal for the respective column or the shift signal from the logic circuit for the adjacent column.

15. The system of claim 14 wherein the select signal steering circuit further comprises first and second logic circuits corresponding to the first and second redundant columns of memory cells, each of the first and second logic circuits receiving the select signal for an adjacent column of memory cells and a shift signal from the logic circuit for the adjacent column, the shift signal indicating that the select signal for the adjacent column is being shifted, each of the first and second logic circuits being operable to output the select signal for the adjacent column to the respective redundant column responsive to receiving the shift signal from the logic circuit for the adjacent column.

16. The system of claim 11 wherein the defective memory cell decoder is operable to output a shift control signal indicating a shift direction for the select signal for the defective column, and to output respective shift control signals indicating a shift direction for respective select signals for the remaining columns that are to be shifted, and wherein the select signal steering circuit is operable to shift each of the select signals responsive to the respective ones of the shift control signals received from the defective memory cell decoder.

17. The system of claim 16 wherein the defective memory cell decoder comprises an address decoder for each of the columns of memory cells, each of the address decoders being operable to decode the address from the programmable circuit and to output the shift control signal responsive to decoding an address corresponding to the respective column.

18. The system of claim 17 wherein the select signal steering circuit comprises a plurality of logic circuits corresponding in number to the number of columns of memory cells, each of the logic circuits comprising a first logic gate having an input receiving the select signal for the respective column and a second logic gate receiving the select signal for a column adjacent the respective column, the logic gates further receiving respective shift control signals that are operable to enable the first logic gate if the select signal for the respective column is not to be shifted and to enable the second logic gate if the select signal for the respective column is to be shifted.

19. The system of claim 11, further comprising a swap circuit coupled between the programmable circuit and the defective memory cell decoder, the swap circuit being operable in a first mode to couple the first defective column address to a first output and the second defective column address to a second output, and being operable in a second mode to couple the first defective column address to the second output and the second defective column address to the first output.

20. The system of claim 11, wherein the first circuit included in the programmable circuit comprises a first fuse bank and the second circuit included in the programmable circuit comprises a second fuse bank.

21. In a memory device, a system for selecting redundant columns of memory cells, comprising:
    first means for outputting first and second defective column addresses corresponding to respective first and second defective column of memory cells;
    second means for outputting a first shift control signal corresponding to the first defective column address and to a first shift direction, and for outputting a second shift control signal corresponding to the second defective column address and a second shift direction that is opposite the first shift direction;
    third means responsive to the first shift control signal for shifting in the direction indicated by the first shift control signal the select signal for the first defective column to an adjacent column of memory cells, for shifting in the first direction the select signal for one of the columns to a first redundant column of memory cells, for shifting in the first direction respective select signals for the columns intermediate the first defective column and the first redundant column to respective adjacent columns of memory cells; and
    fourth means responsive to the second shift control signal for shifting in the second direction the select signal for the second defective column to an adjacent column of memory cells, for shifting in the second direction the select signal for one of the columns to a second redundant set of memory cells, and for shifting in the second direction respective select signals for the columns intermediate the second defective column and the second redundant column to respective adjacent sets of memory cells.

22. The system of claim 21 wherein the first and second means are operable to leave unshifted the select signals for the columns of memory cells intermediate the first defective column and the second defective column.

23. The system of claim 21 wherein the second means includes means for outputting respective shift control signals indicating a shift direction for only the select signals for the defective columns, and wherein the third and fourth means shift the select signal for the defective columns and the select signals for the remaining columns that are shifted responsive to the shift control signals for the defective columns.

24. The system of claim 21 wherein the second means includes means for outputting a shift control signal indicating a shift direction for the select signal for the defective column, and means for outputting respective shift control signals indicating a shift direction for respective select signals for the remaining columns that are to be shifted, and wherein the third and fourth means shift each of the select signals responsive to the respective ones of the shift control signals received from the second means.

25. The system of claim 21, further comprising swapping means for selectively swapping the first defective column address with the second defective column address.

26. A column select steering circuit receiving a plurality of column select signals corresponding to a plurality of columns of memory cells, the column select steering circuit comprising a plurality of logic circuits coupled to receive the column select signal for the corresponding column and the column select signal for a first column adjacent to the corresponding column, the logic circuits being operable to couple the select signals for the respective corresponding columns to a respective output in a first mode, and to couple the select signals for the respective first adjacent columns to the respective output in a second mode.

27. The column steering circuit of claim 26 wherein each of the logic circuits are further coupled to receive the column select signal for a second column adjacent to the corresponding column, and wherein the logic circuits are operable to couple the select signals for the respective second adjacent column to the respective output in a third mode.

28. The column steering circuit of claim 26 wherein each of the logic circuits further receives a respective shift control signal, and wherein each of the logic circuits is operable to couple the select signals for the respective first adjacent column to the respective output responsive to the shift control signal.

29. The column steering circuit of claim 26 wherein each of the logic circuits is further operable to output a sift control signal responsive to coupling the select signals for the respective first adjacent column to the respective output in the second mode.

30. A memory device, comprising:
a row address circuit operable to receive and decode row address signals applied to external address terminals of the memory device;
a column address circuit operable to receive and decode column address signals applied to the external address terminals;
an array of memory cells operable to store data written to or read from the array at a location determined by the decoded row address signals and the decoded column address signals;
a data path circuit operable to couple data signals corresponding to the data between the array and external data terminals of the memory device, the data path circuit including a plurality of write receivers each coupled to a respective one of the external data terminals and a plurality of read transmitters each coupled to a respective one of the external data terminals;
a command decoder operable to decode a plurality of command signals applied to respective external command terminals of the memory device, the command decoder being operable to generate control signals corresponding to the decoded command signals; and
a system for selecting redundant sets of memory cells, comprising
a programmable circuit that is programmed to output an address corresponding to a defective set of memory cells;
a defective memory cell decoder coupled to receive the address from the programmable circuit, the defective memory cell decoder outputting at least one shift control signal corresponding to the address from the programmable circuit, the at least one shift control signal indicating a shift direction for a select signal for the defective set corresponding to the address; and
a select signal steering circuit coupled to receive the at least one shift control signal from the defective memory cell decoder, the select signal steering circuit being operable to shift in the direction indicated by the shift control signal the select signal for the defective set to an adjacent set of memory cells, to shift in the direction indicated by the at least one shift control signal the select signal for one of the sets to a redundant set of memory cells, and to shift in the direction indicated by the at least one shift control signal respective select signals for the sets intermediate the defective set and the one set to respective adjacent sets of memory cells.

31. The memory device of claim 30 wherein the memory device comprises a dynamic random access memory device.

32. The memory device of claim 31 wherein the dynamic random access memory device comprises a synchronous random access memory device.

33. The memory device of claim 30 wherein each of the sets of memory cells comprises a respective column of memory cells.

34. The memory device of claim 30 wherein the defective memory cell decoder is operable to output a shift control signal indicating a shift direction for only the select signal for the defective set, and wherein the select signal steering circuit is operable to shift the select signal for the defective set and the select signals for the remaining sets that are shifted responsive to the one shift control signal.

35. The memory device of claim 34 wherein the select signal steering circuit comprises a plurality of logic circuits corresponding in number to the number of sets of memory cells, each of the logic circuits receiving the select signal for the respective set and a shift signal from the logic circuit for an adjacent set of memory cells, the shift signal indicating that the select signal for the adjacent set is being shifted, each of the logic circuits being operable to output the select signal for the adjacent set responsive to receiving either the shift control signal for the respective set or the shift signal from the logic circuit for the adjacent set, and being operable to output the select signal for the respective set in the absence of receiving either the shift control signal for the respective set or the shift signal from the logic circuit for the adjacent set.

36. The memory device of claim 35 wherein the select signal steering circuit further comprises a logic circuit corresponding to the redundant set of memory cells, the logic circuit corresponding to the redundant set receiving the select signal for an adjacent column and a shift signal from the logic circuit for the adjacent column of memory cells, the shift signal indicating that the select signal for the adjacent set is being shifted, the logic circuit corresponding to the redundant set being operable to output the select signal for the adjacent set to the redundant set responsive to receiving the shift signal from the logic circuit for the adjacent set.

37. The memory device of claim 30 wherein the defective memory cell decoder is operable to output a shift control signal indicating a shift direction for the select signal for the defective set, and to output respective shift control signals indicating a shift direction for respective select signals for the remaining sets that are to be shifted, and wherein the select signal steering circuit is operable to shift each of the select signals responsive to the respective ones of the shift control signals received from the defective memory cell decoder.

38. The memory device of claim 37 wherein the defective memory cell decoder comprises an address decoder for each of the sets of memory cells, each of the address decoders being operable to decode the address from the programmable circuit and to output the shift control signal responsive to decoding an address corresponding to the respective set.

39. The memory device of claim 38 wherein the select signal steering circuit comprises a plurality of logic circuits corresponding in number to the number of sets of memory cells plus the number of redundant sets of memory cells, each of the logic circuits comprising a first logic gate having an input receiving the select signal for the respective set and a second logic gate receiving the select signal for a set adjacent the respective set, the logic gates further receiving respective shift control signals that are operable to enable the first logic gate if the select signal for the respective set is not to be shifted and to enable the second logic gate if the select signal for the respective set is to be shifted.

40. The memory device of claim 30 wherein:
the programmable circuit comprises a first circuit that may be programmed to output a first address corresponding to a first defective set of memory cells and a first shift direction, and a second circuit that may be programmed to output a second address corresponding to a second defective set of memory cells and a second shift direction that is opposite the first shift direction;
wherein the defective memory cell decoder is operable to output a first shift control signal corresponding to the first address, and a second shift control signal corresponding to the second address; and
wherein the select signal steering circuit is operable responsive to the first shift control signal to shift in the first direction the select signal for the first defective set to an adjacent set, to shift in the first direction the select signal for one of the sets to a first redundant set of memory cells, and to shift in the first direction respective select signals for the sets intermediate the first defective set and the first redundant set to respective adjacent sets of memory cells, and wherein the select signal steering circuit is further operable responsive to the second shift control signal to shift in the second direction the select signal for the second defective set to an adjacent set, to shift in the second direction the select signal for one of the sets to a second redundant set of memory cells, and to shift in the second direction respective select signals for the sets intermediate the second defective set and the second redundant set to respective adjacent sets of memory cells.

41. The memory device of claim 40, further comprising a swap circuit coupled between the programmable circuit and the defective memory cell decoder, the swap circuit being operable in a first mode to couple the first address to a first output and a second address to a second output, and being operable in a second mode to couple the first address to the second output and the second address to the first output.

42. A memory device, comprising:
a row address circuit operable to receive and decode row address signals applied to external address terminals of the memory device;
a column address circuit operable to receive and decode column address signals applied to the external address terminals;
an array of memory cells operable to store data written to or read from the array at a location determined by the decoded row address signals and the decoded column address signals;
a data path circuit operable to couple data signals corresponding to the data between the array and external data terminals of the memory device, the data path circuit including a plurality of write receivers each coupled to a respective one of the external data terminals and a plurality of read transmitters each coupled to a respective one of the external data terminals;
a command decoder operable to decode a plurality of command signals applied to respective external command terminals of the memory device, the command decoder being operable to generate control signals corresponding to the decoded command signals; and
a system for selecting redundant columns of memory cells, comprising
a programmable circuit comprising a first circuit that may be programmed to output a first defective column address corresponding to a first defective column of memory cells, and a second circuit that may be programmed to output a second defective column address corresponding to a second defective column of memory cells;
a defective column decoder coupled to receive the first and second defective column addresses from the programmable circuit, the defective column decoder being operable to output a first shift control signal corresponding to the first defective column address and to a first shift direction, and a second shift control signal corresponding to the second defective column address and a second shift direction that is opposite the first shift direction; and
a column select steering circuit coupled to receive the first and second shift control signals from the defective column decoder, the column select steering circuit being operable responsive to the first shift control signal to shift in the direction indicated by the first shift control signal the select signal for the first defective column to an adjacent column of memory cells, to shift in the first direction the select signal for one of the columns to a first redundant column of memory cells, to shift in the first direction respective select signals for the columns intermediate the first defective column and the first redundant column to respective adjacent columns of memory cells, and wherein the select signal steering circuit is further operable responsive to the second shift control signal to shift in the second direction the select signal for the second defective column to an adjacent column of memory cells, to shift in the second direction the select signal for one of the columns to a second redundant set of memory cells, and to shift in the second direction respective select signals for the columns intermediate the second defective column and the second redundant column to respective adjacent sets of memory cells.

43. The memory device of claim 42 wherein the column select steering circuit is operable to leave unshifted the select signals for the columns of memory cells intermediate the first defective column and the second defective column.

44. The memory device of claim 42 wherein the defective memory cell decoder is operable to output respective shift control signals indicating a shift direction for only the select signals for the defective columns, and wherein the select signal steering circuit is operable to shift the select signal for the defective columns and the select signals for the remaining columns that are shifted responsive to the shift control signals for the defective columns.

45. The memory device of claim 44 wherein the select signal steering circuit comprises a plurality of logic circuits corresponding in number to the number of columns of memory cells, each of the logic circuits receiving the select signal for the respective column and a shift signal from the logic circuit for an adjacent column of memory cells, the shift signal indicating that the select signal for the adjacent column is being shifted, each of the logic circuits being operable to shift the select signal for the respective column responsive to receiving either the shift control signal for the respective column or the shift signal from the logic circuit for the adjacent column.

46. The memory device of claim 45 wherein the select signal steering circuit further comprises first and second logic circuits corresponding to the first and second redundant columns of memory cells, each of the first and second logic circuits receiving the select signal for an adjacent column of memory cells and a shift signal from the logic circuit for the adjacent column, the shift signal indicating that the select signal for the adjacent column is being shifted, each of the first and second logic circuits being operable to output the select signal for the adjacent column to the respective redundant column responsive to receiving the shift signal from the logic circuit for the adjacent column.

47. The memory device of claim 42 wherein the defective memory cell decoder is operable to output a shift control signal indicating a shift direction for the select signal for the defective column, and to output respective shift control signals indicating a shift direction for respective select signals for the remaining columns that are to be shifted, and wherein the select signal steering circuit is operable to shift each of the select signals responsive to the respective ones of the shift control signals received from the defective memory cell decoder.

48. The memory device of claim 47 wherein the defective memory cell decoder comprises an address decoder for each of the columns of memory cells, each of the address decoders being operable to decode the address from the programmable circuit and to output the shift control signal responsive to decoding an address corresponding to the respective column.

49. The memory device of claim 48 wherein the select signal steering circuit comprises a plurality of logic circuits corresponding in number to the number of columns of memory cells, each of the logic circuits comprising a first logic gate having an input receiving the select signal for the respective column and a second logic gate receiving the select signal for a column adjacent the respective column, the logic gates further receiving respective shift control signals that are operable to enable the first logic gate if the select signal for the respective column is not to be shifted and to enable the second logic gate if the select signal for the respective column is to be shifted.

50. The memory device of claim 42, further comprising a swap circuit coupled between the programmable circuit and the defective memory cell decoder, the swap circuit being operable in a first mode to couple the first defective column address to a first output and the second defective column address to a second output, and being operable in a second mode to couple the first defective column address to the second output and the second defective column address to the first output.

51. The memory device of claim 42, wherein the first circuit included in the programmable circuit comprises a first fuse bank and the second circuit included in the programmable circuit comprises a second fuse bank.

52. The memory device of claim 42 wherein the memory device comprises a dynamic random access memory device.

53. The memory device of claim 52 wherein the dynamic random access memory device comprises a synchronous random access memory device.

54. A computer system, comprising:
a processor having a processor bus;
an input device coupled to the processor through the processor bus to allow data to be entered into the computer system;
an output device coupled to the processor through the processor bus to allow data to be output from the computer system;
a data storage device coupled to the processor through the processor bus to allow data to be read from a mass storage device;
a memory controller coupled to the processor through the processor bus; and
a memory device coupled to the memory controller, the memory device comprising:
  a row address circuit operable to receive and decode row address signals applied to external address terminals of the memory device;
  a column address circuit operable to receive and decode column address signals applied to the external address terminals;
  an array of memory cells operable to store data written to or read from the array at a location determined by the decoded row address signals and the decoded column address signals;
  a data path circuit operable to couple data signals corresponding to the data between the array and external data terminals of the memory device, the data path circuit including a plurality of write receivers each coupled to a respective one of the external data terminals and a plurality of read transmitters each coupled to a respective one of the external data terminals;
  a command decoder operable to decode a plurality of command signals applied to respective external command terminals of the memory device, the command decoder being operable to generate control signals corresponding to the decoded command signals; and
  a system for selecting redundant sets of memory cells, comprising
    a programmable circuit that is programmed to output an address corresponding to a defective set of memory cells;
    a defective memory cell decoder coupled to receive the address from the programmable circuit, the defective memory cell decoder outputting at least one shift control signal corresponding to the address from the programmable circuit, the at least one shift control signal indicating a shift direction for a select signal for the defective set corresponding to the address; and a select signal steering circuit coupled to receive the at least one shift control signal from the defective memory cell decoder, the select signal steering circuit being operable to shift in the direction indicated by the shift control signal the select signal for the defective set to an adjacent set of memory cells, to shift in the direction indicated by the at least one shift control signal the select signal for one of the sets to a redundant set of memory cells, and to shift in the direction indicated by the at least one shift control signal respective select signals for the sets intermediate the defective set and the one set to respective adjacent sets of memory cells.

55. The computer system of claim 54 wherein the memory device comprises a dynamic random access memory device.

56. The computer system of claim 55 wherein the dynamic random access memory device comprises a synchronous random access memory device.

57. The computer system of claim 54 wherein each of the sets of memory cells comprises a respective column of memory cells.

58. The computer system of claim 54 wherein the defective memory cell decoder is operable to output a shift control signal indicating a shift direction for only the select signal for the defective set, and wherein the select signal steering circuit is operable to shift the select signal for the defective set and the select signals for the remaining sets that are shifted responsive to the one shift control signal.

59. The computer system of claim 58 wherein the select signal steering circuit comprises a plurality of logic circuits corresponding in number to the number of sets of memory cells, each of the logic circuits receiving the select signal for the respective set and a shift signal from the logic circuit for an adjacent set of memory cells, the shift signal indicating that the select signal for the adjacent set is being shifted, each of the logic circuits being operable to output the select signal for the adjacent set responsive to receiving either the shift control signal for the respective set or the shift signal from the logic circuit for the adjacent set, and being operable to output the select signal for the respective set in the absence of receiving either the shift control signal for the respective set or the shift signal from the logic circuit for the adjacent set.

60. The computer system of claim 59 wherein the select signal steering circuit further comprises a logic circuit corresponding to the redundant set of memory cells, the logic circuit corresponding to the redundant set receiving the select signal for an adjacent column and a shift signal from the logic circuit for the adjacent column of memory cells, the shift signal indicating that the select signal for the adjacent set is being shifted, the logic circuit corresponding to the redundant set being operable to output the select signal for the adjacent set to the redundant set responsive to receiving the shift signal from the logic circuit for the adjacent set.

61. The computer system of claim 54 wherein the defective memory cell decoder is operable to output a shift control signal indicating a shift direction for the select signal for the defective set, and to output respective shift control signals indicating a shift direction for respective select signals for the remaining sets that are to be shifted, and wherein the select signal steering circuit is operable to shift each of the select signals responsive to the respective ones of the shift control signals received from the defective memory cell decoder.

62. The computer system of claim 61 wherein the defective memory cell decoder comprises an address decoder for each of the sets of memory cells, each of the address decoders being operable to decode the address from the programmable circuit and to output the shift control signal responsive to decoding an address corresponding to the respective set.

63. The computer system of claim 62 wherein the select signal steering circuit comprises a plurality of logic circuits corresponding in number to the number of sets of memory cells plus the number of redundant sets of memory cells, each of the logic circuits comprising a first logic gate having an input receiving the select signal for the respective set and a second logic gate receiving the select signal for a set adjacent the respective set, the logic gates further receiving respective shift control signals that are operable to enable the first logic gate if the select signal for the respective set is not to be shifted and to enable the second logic gate if the select signal for the respective set is to be shifted.

64. The computer system of claim 54 wherein:
the programmable circuit comprises a first circuit that may be programmed to output a first address corresponding to a first defective set of memory cells and a first shift direction, and a second circuit that may be programmed to output a second address corresponding to a second defective set of memory cells and a second shift direction that is opposite the first shift direction;
wherein the defective memory cell decoder is operable to output a first shift control signal corresponding to the first address, and a second shift control signal corresponding to the second address; and
wherein the select signal steering circuit is operable responsive to the first shift control signal to shift in the first direction the select signal for the first defective set to an adjacent set, to shift in the first direction the select signal for one of the sets to a first redundant set of memory cells, and to shift in the first direction respective select signals for the sets intermediate the first defective set and the first redundant set to respective adjacent sets of memory cells, and wherein the select signal steering circuit is further operable responsive to the second shift control signal to shift in the second direction the select signal for the second defective set to an adjacent set, to shift in the second direction the select signal for one of the sets to a second redundant set of memory cells, and to shift in the second direction respective select signals for the sets intermediate the second defective set and the second redundant set to respective adjacent sets of memory cells.

65. The computer system of claim 64, further comprising a swap circuit coupled between the programmable circuit and the defective memory cell decoder, the swap circuit being operable in a first mode to couple the first address to a first output and a second address to a second output, and being operable in a second mode to couple the first address to the second output and the second address to the first output.

66. In a memory device in which each of a plurality of sets of memory cells are selected by a respective set select signal, a method of repairing a defective one of the sets of memory cells using a redundant set of memory cells, the method comprising:
shifting the set select signal for the defective set of memory cells to a first of the plurality of sets of memory cells;
shifting the set select signal for a second of the plurality of sets of memory cells to the redundant set of memory cells; and shifting the set select signals for a plurality of sets of memory cells, including the set select signal for the first set of memory cells, to respective other sets of memory cells.

67. The method of claim 66 wherein each of the sets of memory cells comprises a respective column of memory cells.

68. The method of claim 66 wherein the acts of shifting the set select signals for the defective set of memory cells, the second set of memory cells and the plurality of memory cells comprise shifting the set select signals in the same direction.

69. The method of claim 66 wherein the act of shifting the set select signals for the plurality of sets of memory cells comprises shifting the set of select signals for all of the sets of memory cells intermediate the first set of memory cells and the second set of memory cells.

70. A method of repairing at least two defective columns of memory cells using first and second redundant columns of memory cells, the method comprising:
coupling a column select signal for a first defective column of memory cells to a first non-defective column of memory cells;
coupling a column select signal for a second defective column of memory cells to a second non-defective column of memory cells;
coupling a column select signal for a third non-defective column of memory cells to the first redundant column of memory cells;
coupling a column select signal for a fourth non-defective column of memory cells to the second redundant column of memory cells;
coupling a plurality of column select signals for columns intermediate the first non-defective column and the third non-defective column to respective adjacent columns of memory cells; and
coupling a plurality of column select signals for columns intermediate the second non-defective column and the fourth non-defective column to respective adjacent columns of memory cells.

71. The method of claim 66 wherein each of the sets of memory cells comprises a respective column of memory cells.

72. The method of claim 70 wherein the act of coupling a plurality of column select signals for columns intermediate the first non-defective column and the third non-defective column to respective adjacent columns of memory cells comprises coupling the column select signal for the first non-defective column of memory cells to an adjacent column of memory cells, and wherein the act of coupling a plurality of column select signals for columns intermediate the second non-defective column and the fourth non-defective column to respective adjacent columns of memory cells comprises coupling the column select signal for the second non-defective column of memory cells to an adjacent column of memory cells.

73. The method of claim 70, further comprising programming the memory device with first and second defective column addresses corresponding to the location of the first and second defective columns of memory cells.

74. A method of coupling data to or from an array of memory cells arranged in rows and columns, the data being written to or read from a memory cell in a row and column corresponding to a row address and a column address, respectively, at least one of the rows or columns of memory cells being defective but being repairable by using a redundant row or column of memory cells, respectively, the method comprising:
coupling data directed to or from a memory cell in the defective row or column that corresponds to a defective row or column address, respectively, to or from a memory cell in a first non-defective row or column, respectively, that corresponds to a first row or column address, respectively;
coupling data directed to or from a memory cell in a second non-defective row or column corresponding to a second non-defective row or column address, respectively, to or from a memory cell in the redundant row or column, respectively; and
coupling data directed to or from a plurality of memory cells in respective rows or columns corresponding to respective target row or column address that are intermediate the first non-defective row or column address, respectively, and the second non-defective row or column address, respectively, to rows or columns, respectively, that correspond to row or column addresses that are adjacent the respective target row or column addresses.

75. The method of claim 74 wherein a second of the rows or columns of memory cells may be defective but repairable by using a second redundant row or column of memory cells, respectively, wherein the first non-defective row or column address is one greater than the defective row or column address, respectively, wherein the row or column addresses that are adjacent the respective target row or column addresses are one greater than the respective target row or column addresses, and wherein the method further comprises:
coupling data directed to or from a memory cell in the second defective row or column that corresponds to a second defective row or column address, respectively, to or from a memory cell in a third non-defective row or column, respectively, that corresponds to a third row or column address, respectively, the third non-defective row or column address being one less than the defective row or column address, respectively;
coupling data directed to or from a memory cell in a fourth non-defective row or column corresponding to a fourth non-defective row or column address, respectively, to or from a memory cell in the second redundant row or column, respectively; and
coupling data directed to or from a plurality of memory cells in respective rows or columns corresponding to respective second target row or column address that are intermediate the third non-defective row or column address, respectively, and the fourth non-defective row or column address, respectively, to rows or columns, respectively, that correspond to row or column addresses that are one less than the respective second target row or column addresses.

* * * * *